(12) United States Patent
Tokura et al.

(10) Patent No.: US 8,354,691 B2
(45) Date of Patent: Jan. 15, 2013

(54) LATERAL INSULATED-GATE BIPOLAR TRANSISTOR

(75) Inventors: Norihito Tokura, Okazaki (JP); Shigeki Takahashi, Okazaki (JP); Youichi Ashida, Nukata-gun (JP); Akio Nakagawa, Chigasaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/226,636

(22) Filed: Sep. 7, 2011

(65) Prior Publication Data
US 2012/0061726 A1 Mar. 15, 2012

(30) Foreign Application Priority Data

Sep. 9, 2010 (JP) .................................. 2010-202188
Jul. 5, 2011 (JP) .................................. 2011-149210

(51) Int. Cl.
*H01L 29/739* (2006.01)
(52) U.S. Cl. .................................. 257/141; 257/E29.197
(58) Field of Classification Search .................. 257/141, 257/E29.197
See application file for complete search history.

(56) References Cited

U.S. PATENT DOCUMENTS

| | | | |
|---|---|---|---|
| 5,982,015 A | 11/1999 | Hirayama et al. | |
| 6,133,607 A | 10/2000 | Funaki et al. | |
| 7,498,634 B2 * | 3/2009 | Tsuzuki et al. | 257/341 |

FOREIGN PATENT DOCUMENTS

| | | |
|---|---|---|
| JP | A-06-61495 | 3/1994 |
| JP | B2-4097416 | 3/2008 |

OTHER PUBLICATIONS

Funaki et al., "Lateral SOI Diode Design Optimization for High Ruggedness and Low Temperature Dependence of Reverse Recovery Characteristics," *Proceedings of 1998 International Symposium on Power Semiconductor Devices & ICs*, 98 Kyoto, Jul. 3, 1998, pp. 33-36.

Nakagawa et al., "Improvement in Lateral IGBT Design for 500V 3A One Chip Inverter ICs," *International Symposium on Semiconductor Devices & ICs*, 99 Toronto, May 28, 1999, pp. 321-324.

* cited by examiner

*Primary Examiner* — Calvin Lee
*Assistant Examiner* — Monica D Harrison
(74) *Attorney, Agent, or Firm* — Posz Law Group, PLC

(57) ABSTRACT

A N-channel lateral insulated-gate bipolar transistor includes a semiconductor substrate, a drift layer, a collector region, a channel layer, an emitter region, a gate insulation film, a gate electrode, a collector electrode, an emitter electrode. The collector region includes a high impurity concentration region having a high impurity concentration and a low impurity concentration region having a lower impurity concentration than the high impurity concentration region. The collector electrode is in ohmic contact with the high impurity concentration region and in schottky contact with the low impurity concentration region.

8 Claims, 19 Drawing Sheets

LATERAL INSULATED-GATE BIPOLAR TRANSISTOR

CROSS REFERENCE TO RELATED APPLICATIONS

This application is based on Japanese Patent Applications No. 2010-202188 filed on Sep. 9, 2010, and No. 2011-149210 filed on Jul. 5, 2011, the disclosures of which are incorporated herein by reference.

TECHNICAL FIELD

The present invention relates to a lateral insulated-gate bipolar transistor (hereafter referred to as IGBT), and more specifically to a lateral IGBT formed on a SOI (i.e. Silicon on insulator) substrate.

BACKGROUND

Monolithic inverter IC chips, in which integrated parts such as a lateral IGBT, a lateral diode, an analog circuit and a digital circuit are constructed on a SOI (Silicon on insulator) substrate, are developed and utilized. A performance of the inverter IC is mainly determined by the integrated lateral IGBT and the lateral diode. The important performance indexes of the lateral IGBT are a low on-state voltage and a high switching speed, and the important performance indexes of the lateral diode are also a low on-state voltage and a high switching speed. Specifically, it is necessary for the lateral IGBT to maintain the low on-state voltage and the high switching speed without controlling a lifetime, which is performed by irradiating an electron beam. Additionally, reducing a carrier concentration of an on-state by reducing an efficiency of hole injection to a collector is very important.

Conventionally, a double-layered collector region includes a large P-well region having a low impurity concentration and a small $P^+$-type region having a high impurity concentration. The P-well region and the $P^+$-type region are both in ohmic contact with a collector electrode so as to suppress a total amount of acceptor impurities in the collector region. Further, a N-type buffer layer that surrounds the low impurity concentration P-well region and the high impurity concentration $P^+$-type region provides a donor-type impurity effect so that hole injection is restricted. Therefore, the efficiency of hole injection is reduced as shown in JP 3415441 (corresponding to U.S. Pat. No. 6,133,607).

However, based on a study by inventors of the present invention, it is found that the double-layered structure of the collector region causes an increase in variation of on-state voltage in a case where a fall time $t_f$ is set to 0.3 μsec or less.

The low on-state voltage and the high switching speed are in a trade-off relationship. Therefore, basically the fall time decreases with the increasing on-state voltage. However, as shown in JP 3415441 (corresponding to U.S. Pat. No. 6,133,607), the trade-off relationship between the low on-state voltage and the high switching speed no longer exits in a structure in which the double-layered collector region is in ohmic contact with the collector electrode. Further, the fall time can not be reduced by a sacrifice of the on-state voltage and the variation of the on-state voltage is increased. In the conventional IGBT, in which the collector electrode is in ohmic contact with the collector region, the fall time does not decrease stably with the increasing on-state voltage after the fall time is reduced to a certain level. Therefore, the switching speed can not be improved higher than a certain level. According to an analysis by inventors of the present invention, a surface of the P-well channel layer having a low impurity concentration is in an unstable contact with the collector electrode in a case where a surface impurity concentration of the P-well channel layer is set to, for example, $1 \times 10^{17}$ $cm^{-3}$ and the collector electrode is made of aluminum including 1% of silicon. The unstable contact between the surface of the P-well channel layer and the collector electrode causes the variation of the on-state voltage.

SUMMARY

In view of the foregoing difficulties, it is an object of the present invention to provide a lateral IGBT in which a high switching speed can be achieved.

According to an aspect of the present disclosure, a N-channel lateral insulated-gate bipolar transistor includes a semiconductor substrate; a drift layer having a N conductive type and disposed on the substrate; a collector region which is a P conductive type and is disposed in a first surface portion of the drift layer; a channel layer which is a P conductive type and is disposed in a second surface portion of the drift layer apart from the collector region; an emitter region which is a N conductive type and has a higher impurity concentration than the drift layer and, the emitter region disposed in a first surface portion of the channel layer and having an end portion terminated inside of a terminated portion of the channel layer; a gate insulation film disposed on a channel region, which is provided by a second surface portion of the channel layer between the emitter region and the drift layer; a gate electrode disposed on the gate insulation film; a collector electrode electrically coupled with the collector region; and an emitter electrode electrically coupled with the emitter region and the channel layer. The collector region includes a high impurity concentration region having a high impurity concentration and a low impurity concentration region having a lower impurity concentration than the high impurity concentration region. The collector electrode is in ohmic contact with the high impurity concentration region and in schottky contact with the low impurity concentration region.

In the above device, since the collector electrode is in ohmic contact with the high impurity concentration region and in schottky contact with the low impurity concentration region, an efficiency of hole injection is reduced by restricting hole injection. Therefore, a lateral IGBT structured to achieve a high switching speed without controlling a lifetime can be obtained.

BRIEF DESCRIPTION OF THE DRAWINGS

The above and other objects, features and advantages of the present invention will become more apparent from the following detailed description made with reference to the accompanying drawings. In the drawings:

FIG. 4 is a graph showing a relationship between a work function $\phi_m[eV]$ and an efficiency of hole injection (hole current $I_h$/collector current $I_c$) of a barrier metal 12a;

FIG. 6 is a diagram showing a cross sectional view of the lateral IGBT when the lateral IGBT is on;

DETAILED DESCRIPTION

First Embodiment

Figure 1:
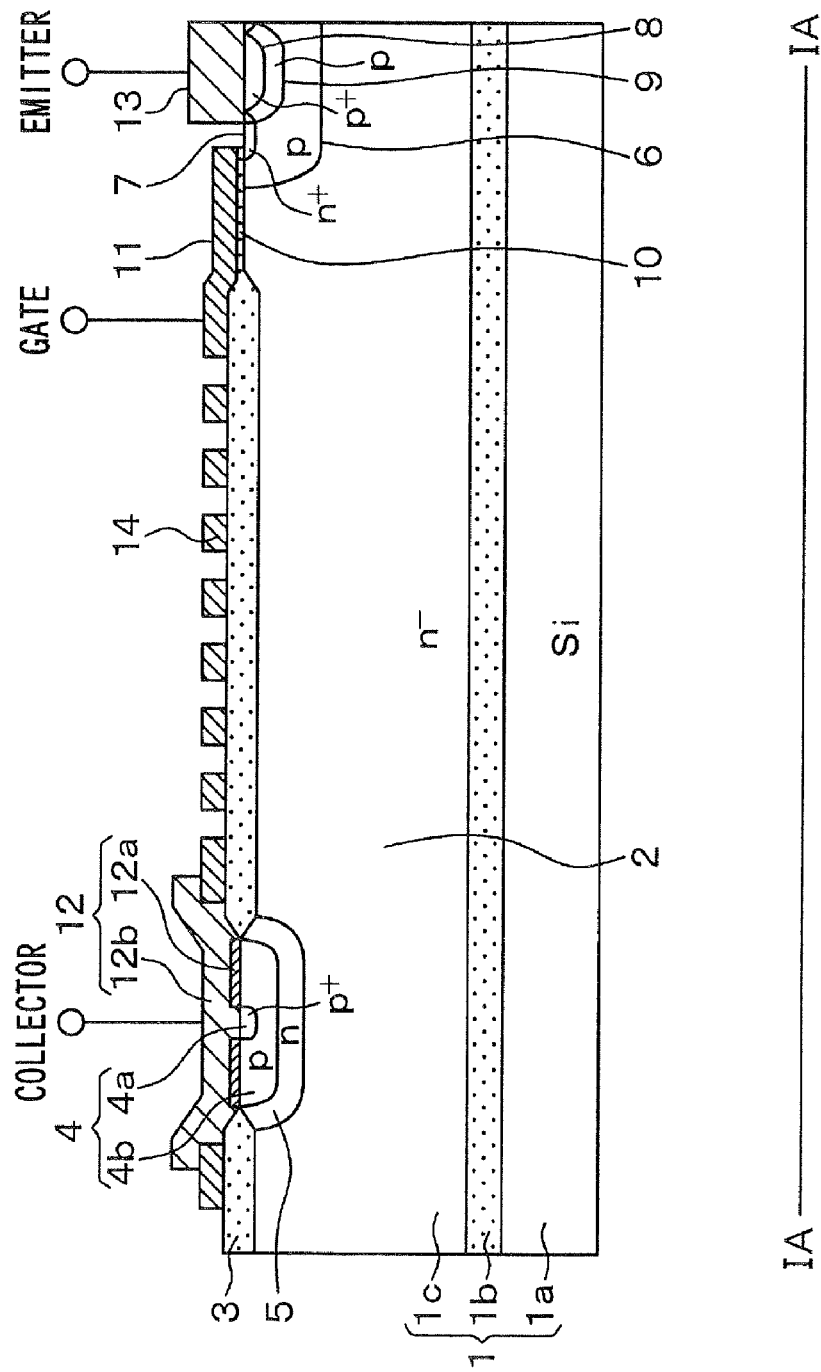
FIG. 1 is a diagram showing a cross sectional view of a N-channel lateral IGBT according to a first embodiment of the present invention.
Figure 2:
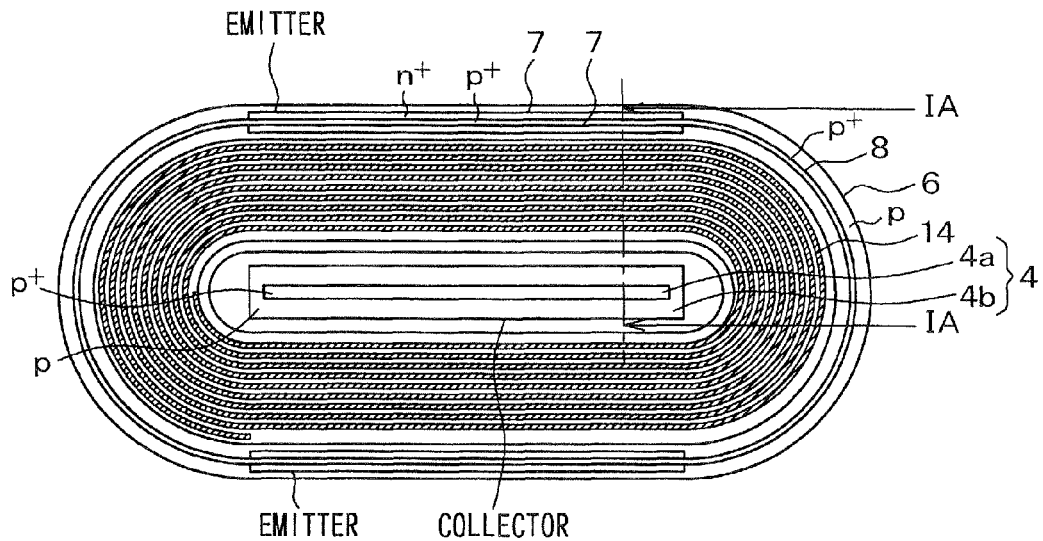
FIG. 2 is a diagram showing a top plan view of a layout of the lateral IGBT shown in FIG. 1.

A first embodiment of the present invention will be described. FIG. 2 shows a single cell of the lateral IGBT. FIG. 1 is a cross sectional view taken along a line IA-IA in FIG. 2. A structure of the lateral IGBT according to the present embodiment will be described with reference to the above-described drawings.

As shown in FIG. 1, a SOI substrate 1 is used as a semiconductor substrate of the N-channel lateral IGBT in the present embodiment. The SOI substrate 1 is formed in such a manner that an active layer 1c is formed on a support substrate 1a with a buried oxide (BOX) 1b interposed therebetween. The support substrate 1a is made of material such as silicon, and the active layer 1c is made of silicon. In the present embodiment, the active layer 1c functions as a N⁻-type drift layer 2 and each component part of the lateral IGBT is formed in a surface portion of the N⁻-type drift layer 2.

The buried oxide 1b and the active layer 1c (N⁻-type drift layer 2) of the SOI substrate can have any thickness and any impurity concentration in a condition that the lateral IGBT can have a predetermined breakdown voltage. For example, the buried oxide 1b can be formed 4 μm or greater thick to obtain a high breakdown voltage. Specifically, the buried oxide 1b may also be formed 5 μm thick to obtain a stable breakdown voltage of 600 V. Additionally, the active layer 1c may have a N-type impurity concentration in a range between $1\times10^{14}$ cm$^{-3}$ and $1.2\times10^{15}$ cm$^{-3}$ to obtain a stable breakdown voltage of 600 V in a case where the active layer 1c has a thickness of 15 μm or less, and the active layer 1c may also have a N-type impurity concentration in a range between $1\times10^{14}$ cm$^{-3}$ and $8\times10^{14}$ cm$^{-3}$ to obtain a stable breakdown voltage of 600 V in a case where the active layer has a thickness of 20 μm or less. On a surface of the N⁻-type drift layer 2, a LOCOS oxide film 3 is formed to isolate each component part of the lateral IGBT. As shown in FIG. 2, a collector region 4 is formed to have one direction as a longitudinal direction in a first surface portion of the N⁻-type drift layer 2. The collector region 4 is formed on where the LOCOS oxide film 3 is not formed. The collector region 4, in which different impurity concentration regions are formed, includes a P⁺-type region 4a, which is a high impurity concentration region, and a P-type region 4b, which is a low impurity concentration region. The high impurity concentration region 4a has a relatively high impurity concentration and the low impurity concentration region 4b has a lower impurity concentration than an impurity concentration of the high impurity concentration region 4a.

The P⁺-type region 4a has a surface concentration, for example, in a range between $1\times10^{19}$ cm$^{-3}$ and $1\times10^{20}$ cm$^{-3}$, and the P-type region 4b has a surface concentration, for example, in a range between $1\times10^{16}$ cm$^{-3}$ and $1\times10^{19}$ cm$^{-3}$ or in a range between $1\times10^{15}$ cm$^{-3}$ and $1\times10^{18}$ cm$^{-3}$. In the present embodiment, as shown in FIG. 1 and FIG. 2, the P⁺-type region 4a and the P-type region 4b are formed to have one direction as a longitudinal direction in a strip-like shape, and the P⁺-type region 4a is surrounded by the P-type region 4b.

Additionally, a N-type buffer layer 5, which has a higher impurity concentration than an impurity concentration of the N⁻-type drift layer 2, is formed to surround the collector region 4 in a third surface portion of the N⁻-type drift layer 2. The N-type buffer layer 5 functions as a FS (Field Stop) layer, and is formed of a N-type layer, which has a higher impurity concentration than an impurity concentration of the N⁻-type drift layer 2. Therefore, the N-type buffer layer 5 can restrict a depletion region from expanding so that a performance of breakdown voltage and a performance of stationary loss can be improved. For example, the N-type buffer layer 5 has an impurity concentration in a range between $4\times10^{16}$ cm$^{-3}$ and $1\times10^{18}$ cm$^{-3}$.

Additionally, a P-well channel layer 6, a N⁺-type emitter region 7, a P⁺-type contact layer 8 and a P-type body layer 9 are formed around a center of the collector region 4 in a second surface portion of the N⁻-type drift layer 2, on where the LOCOS oxide film 3 is not formed.

The P-well channel layer 6 provides a channel region in a second surface portion of the P-well channel layer 6. For example, the P-well channel layer 6 is formed to have a thickness of 2 μm or less and a width of 6 μm or less. As shown in FIG. 2, the P-well channel layer 6 is formed concentrically around the center of the collector region 4 (and a collector 12 described below) to surround a periphery of the collector region 4 once.

The N+-type emitter region 7 is disposed in a first surface portion of the P-well channel layer 6 in such a manner that an end portion of the N+-type emitter region 7 is terminated inside of a terminated portion of the P-well channel layer 6. The N+-type emitter region 7 is formed to have a longitudinal direction equal to a longitudinal direction of the collector region 4. As shown in FIG. 2, the N+-type emitter region 7 is not formed in corner portions of the collector region 4. That is, the N+-type emitter region 7 is not formed in both ends of the collector region 4 in the one direction as the longitudinal direction, but is formed linearly in parallel with the collector region 4. In the present embodiment, the P+-type contact layer 8 and the P-type body layer 9 are sandwiched between two adjacent N+-type emitter regions 7.

The P+-type contact layer 8 fixes the P-well channel layer 6 to a emitter potential. The P+-type contact layer 8 has a higher impurity concentration than an impurity concentration of the P-well channel layer 6. As shown in FIG. 2, the P+-type contact layer 8 is also formed concentrically around the center of the collector region 4 (and the collector 12 described below) to surround the periphery of the collector region 4 once.

The P-type body layer 9 functions to reduce a voltage drop caused by a hole current that flows from the collector to an emitter via a surface portion of the lateral IGBT. The P-type body layer 9 is also formed concentrically around the center of the collector region 4 (and the collector 12 described below) to surround the periphery of the collector region 4 once. The P-type body layer 9 can restrict a parasitic NPN transistor that is formed by the N+-type emitter region 7, the P-well channel layer 6 and the N−-type drift layer 2 from operating. Therefore, a turn-off time can be improved furthermore.

As shown in FIG. 2, in each cell, the collector region 4 (and a collector 12 described below) is sandwiched between the P-well channel layer 6, the N+-type emitter region 7, the P+-type contact layer 8 and the P-type body layer 9 at both side.

A gate electrode 11 is formed on the P-well channel layer 6 via a gate insulation film 10 interposed therebetween. The gate electrode 11 is made of material such as doped polysilicon. When a gate voltage is applied to the gate electrode 11, the channel region is formed in the second surface portion of the P-well channel layer 6.

Additionally, on a surface of the collector region 4, a collector electrode 12 is formed to electrically coupled with the collector region 4. Further, on a surface of the N+-type emitter region 7 and the P+-type contact layer 8, an emitter electrode 13 is formed to electrically coupled with the N+-type emitter region 7 and the P+-type contact layer 8.

The collector electrode 12 is in ohmic contact with the P+-type region 4a, and is in schottky contact with the P-type region 4b. In the present embodiment, the collector electrode 12 has a double-layered structure including a barrier metal 12a and an electrode material 12b. A surface of the P-type region 4b is covered by the barrier metal 12a, and a surface of the P+-type region 4a and a surface of the barrier metal 12a are covered by the electrode material 12b. The barrier metal 12a has a same planer pattern with an exposed surface of the P-type region 4b, and the whole exposed surface of the P-type region 4b is covered by the barrier metal 12a. The exposed surface of the P-type region 4b is exposed from the LOCOS oxide film 3.

As a material of the barrier metal 12a, a metal, which can have a reliable schottky contact with the P-type region 4b having a low impurity concentration, can be used. The material of the barrier metal 12a may have a work function of 4.9 eV or less. For example, Ti, TiN or Ni can be used as the material of the barrier metal 12a. As a material of the electrode material 12b, a metal, which can have a reliable ohmic contact with the P+-type region 4a, can be used. For example, Al or Cu can be used as the material of the electrode material 12b.

A resistor layer 14 is formed in a surface portion of the LOCOS oxide film 3, which is formed between the collector and a gate. The resistor layer 14 is formed of a doped polysilicon layer extending longitudinally. The resistor layer 14 is disposed to prevent a biased potential gradient from being generated between the collector and the gate. Specifically, as shown in FIG. 2, the resistor layer 14 is formed in a spiral shape around the collector electrode 12. An end portion of the resistor layer 14 is electrically coupled with the collector electrode 12, and the other end portion of the resistor layer 14 is electrically coupled with the gate electrode 11. Therefore, the end portion of the resistor layer 14, which is electrically coupled with the collector electrode 12, has the same potential with the collector electrode 12, and the potential gradually decreases by an internal resistance of the resistor layer 14 in a direction from the collector side to the emitter side. Therefore, the resistor layer 14 has a potential gradient that is proportional to a distance from the collector electrode 12 to the resistor layer 14. A part of the N−-type drift layer 2, which is formed under the resistor layer 14 via the LOCOS oxide film 13 interposed therebetween, also has the constant potential gradient. Therefore an electric field concentration, which may be caused by the biased potential gradient, can be restricted, and therefore, a breakdown voltage of the device can be improved. Further, impact ionization can be restricted, and therefore, an increase in a switching time can be restricted when the device is switched. (in a turn-off state).

The lateral IGBT in the present embodiment is formed by the above-described structure. In the lateral IGBT having the above-described structure, the channel region is formed in the second surface portion of the P-well channel layer 6 when a predetermined voltage is applied to the gate electrode 11. The second surface portion of the P-well channel layer 6 is a portion, which is sandwiched between the N+-type emitter region 7 and the N−-type drift layer 2 and is placed under the gate electrode 11. Electrons flow into the N−-type drift layer 2 through the channel region from the emitter electrode 13 and the N+-type emitter region 7. At the same time, holes flow into the N−-type drift layer 2 through the collector electrode 12 and the collector region 4. The flow of electrons and holes into the N−-type drift layer 2 causes a conductivity modulation in the N−-type drift layer 2. Therefore, the IGBT can operate over a high current flow between the emitter and the collector.

In the above-described lateral IGBT according to the present embodiment, the collector electrode 12 is in ohmic contact with the P+-type region 4a, and is in schottky contact with the P-type region 4b. Therefore, a hole injection from the collector can be restricted and an efficiency of hole injection can be reduced. Specifically, since the hole injection can be restricted by a contact type between the collector region 4 and the collector electrode 12, the buffer layer 5 can be used only as a FS (field stop) layer without restricting the hole injection. Thus, the buffer layer 5 can have a low impurity concentration that is low enough not to change the efficiency of hole injection in the collector side. Effects that can be achieved by the above-described structure will be described below.

Figure 3:
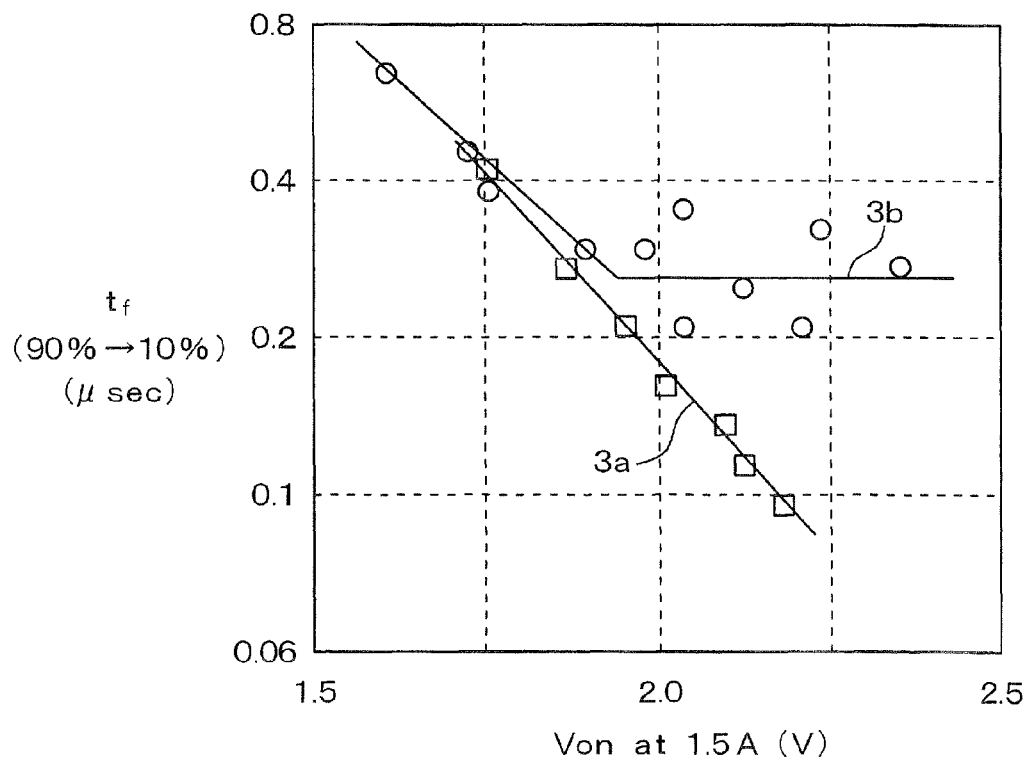
FIG. 3 is a graph showing a relationship between a fall time $t_f$ and an on-state voltage $V_{on}$ of the lateral IGBT according to the first embodiment and a relationship between a fall time $t_f$ and an on-state voltage $V_{on}$ of a conventional lateral IGBT in which a collector electrode is in ohmic contact with a collector region.

FIG. 3 is a graph showing a relationship (shown by 3a) between a fall time $t_f$ and an on-state voltage $V_{on}$ of the lateral IGBT according to the present embodiment and a relationship (shown by 3b) between a fall time $t_f$ and an on-state voltage $V_{on}$ of a conventional lateral IGBT in which a collector electrode is in ohmic contact with a collector region.

As shown in FIG. 3, in the conventional IGBT, the fall time $t_f$ can not be reduced by a sacrifice of the on-state voltage after the fall time $t_f$ is reduced to 0.3 μsec. That is, a trade-off relationship between a high switching speed and the on-state voltage $V_{on}$ no longer exits when the fall time $t_f$ is 0.3 μsec or less.

However, in the lateral IGBT according to the present embodiment, the fall time $t_f$ can be reduced to 0.3 μsec or less. Additionally, even when the fall time is reduced to 0.3 μsec or less, the trade-off relationship between the high switching speed and the on-state voltage $V_{on}$ can be maintained.

In the present embodiment, the collector electrode 12 is in schottky contact with the P-type region 4b to restrict the hole injection and reduce the efficiency of hole injection. Therefore, a lateral IGBT structured to achieve a high switching speed without controlling a lifetime can be obtained.

As described above, in the collector electrode 12, a portion that is in schottky contact with the P-type region 4b is defined as the barrier metal 12a. A metal having a work function of 4.9 eV or less may be used as a material of the barrier metal 12a and the reason will be described with reference to FIG. 4, FIG. 5A and FIG. 5B.

Figure 5A:
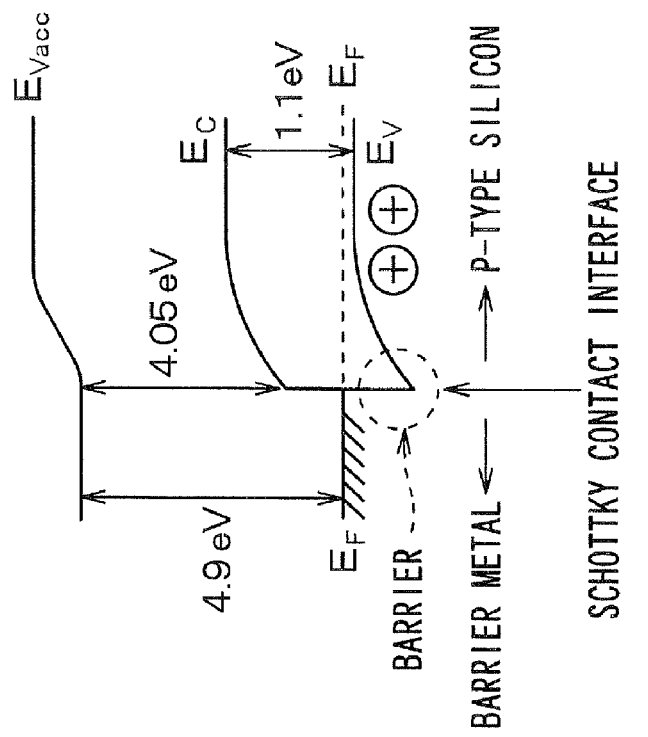
FIGS. 5A and 5B are diagrams showing energy band structures in two cases where a work function $\phi_m$ is respectively 4.5 eV and 4.9 eV.
Figure 5B:
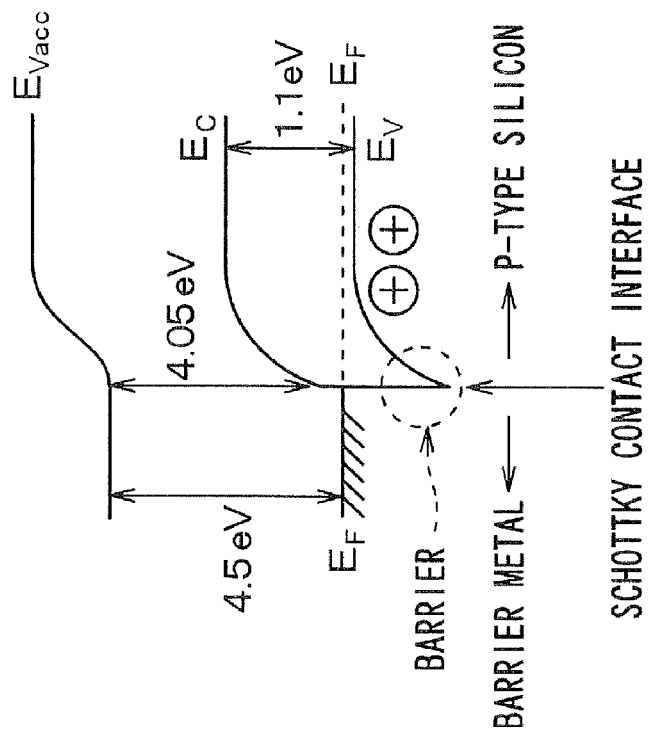

In FIGS. 5A and 5B, $E_{Vacc}$ represents vacuum level energy, $E_F$ represents Fermi level energy, $E_c$ represents conduction band level energy, $E_v$ represents valence band level energy.

Figure 4:
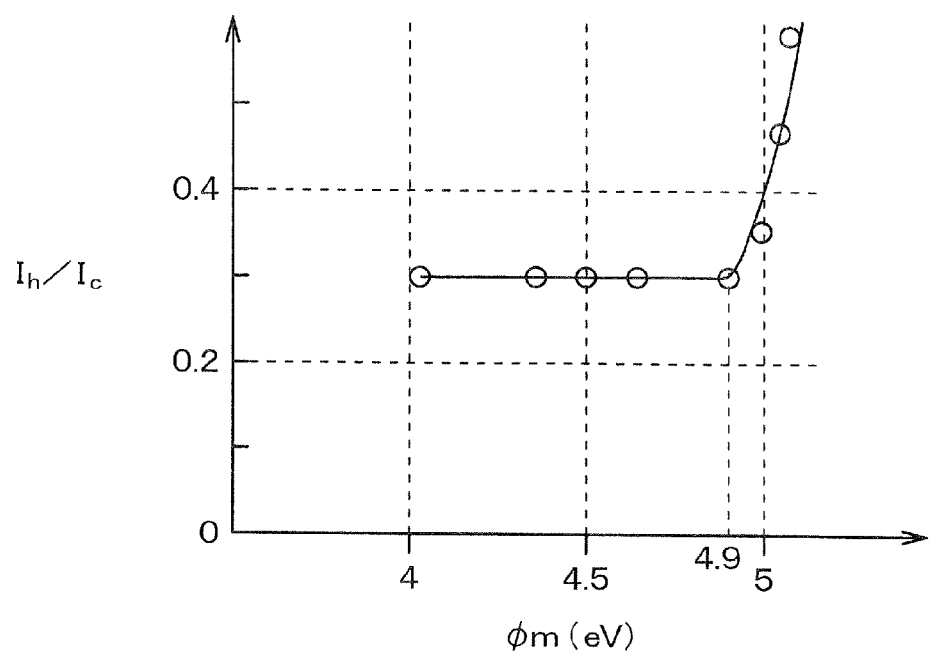

As shown in FIG. 4, the efficiency of hole injection increases and may not be maintained at a low level when the work function is greater than 4.9 eV. In this case, a high switching speed can not be obtained. In the contrast, the efficiency of hole injection can be reduced to 0.3 when the work function is 4.9 eV or less. In this case, a high switching speed can be obtained.

As shown in FIG. 5A, in a case where the work function $\phi_m$ is 4.5 eV, a height of the barrier for holes is sufficiently large so that holes can not flow across the schottky contact interface. As shown in FIG. 5B, in a case where the work function $\phi_m$ is 4.9 eV, the barrier for holes exists slightly so that holes can not flow across the schottky contact interface. In a case where the work function $\phi_m$ is greater than 4.9 eV, the barrier for holes disappears so that holes can be injected from the barrier metal 12a to the P-type region 4b. As described above, the hole injection depends on a level of the work function $\phi_m$ of the barrier metal 12a. Therefore, the work function $\phi_m$ of the barrier metal 12a is set to 4.9 eV or less so that the efficiency of hole injection can be reduced much more and it is possible to speed up a switching operation further more.

As described above, the collector electrode 12 is in ohmic contact with the P+-type region 4a, and is in schottky contact with the P-type region 4b in the lateral IGBT according to the present embodiment. Therefore, the hole injection from the collector can be restricted and the efficiency of hole injection can be reduced. Further, a lateral IGBT structured to achieve a high switching speed without controlling the lifetime can be obtained.

The barrier metal 12a is disposed on the P-type region 4b so that the collector electrode 12 is in schottky contact with the P-type region 4b reliably. In this way, a schottky contact region can be defined and a predetermined region can be stably in schottky contact with the collector electrode 12. Thus, a lateral IGBT having a schottky contact can be easily manufactured. In a manufacturing method of the lateral IGBT according to the present embodiment, a process of forming the barrier metal 12a is added and the other is similar to the conventional manufacturing method of the lateral IGBT. The forming of the barrier metal 12a is performed prior to a formation of the electrode material 12b. For example, a film made of metal such as Ti, Ni and TiN is formed, and then is patterned to remain a part only on the surface of the P-type region 4b. In this way, the barrier metal 12a can be formed.

Additionally, the work function of the barrier metal 12a is set to 4.9 eV or less so that the efficiency of hole injection can be reduced and a high switching speed can be obtained.

As disclosed in JP 3415441 (corresponding to U.S. Pat. No. 6,133,607), conventionally, a collector electrode is in ohmic contact with a collector region to restrict an increase in the on-state voltage. Therefore, it is not supposed that the collector electrode can be partially in schottky contact with the collector region. Specifically, it is not supposed that a predetermined region can be stably in schottky contact with the collector region.

In the lateral IGBT according to the present embodiment, an operating mechanism of turn-off process during the lateral IGBT switches from on-state to off-state will be described with reference to FIG. 6.

Figure 6:
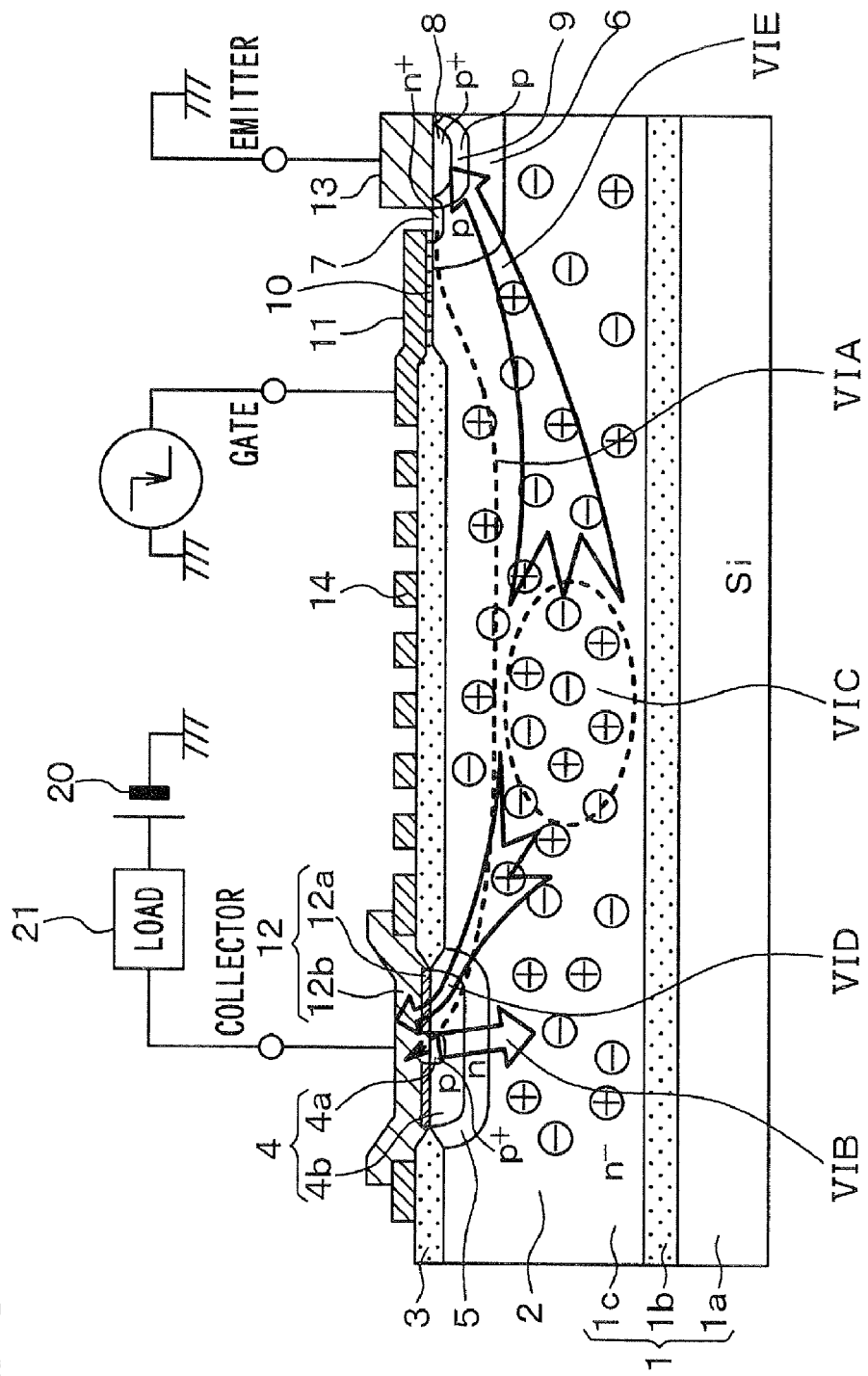

FIG. 6 is a diagram showing a cross sectional view of the lateral IGBT when the lateral IGBT is on. As shown in FIG. 6, the lateral IGBT is used as a switching element. For example, assuming that a circuit switches to supply current from a power source 20 to a load 21, a collector of the lateral IGBT is connected to a low-side of the load 21, and an emitter of the lateral IGBT is connected to the GND. In this circuit, the lateral IGBT according to the present embodiment will operate according to following processes (I) to (IV).

(I) As an initial state, a voltage which is greater than a threshold voltage is applied to the gate electrode 11 so that the channel under the gate electrode 11 is closed. Therefore, electrons flow from the N+-type emitter region 7 to the collector region 4 through the N−-type drift layer 2, and inject into the P+-type region 4a across a P+/P/N junction so that the P+/P/N junction is forward biased. (In FIG. 6, electrons flow in a path shown by dotted arrow VIA.)

When the electrons inject into the P+-type region 4a, holes reversely inject into the N-type buffer layer 5 from the P+-type region 4a as shown by arrow VIB in FIG. 6. Therefore, in the N−-type drift layer 2, a region VIC surrounded by a dotted line can have a high carrier concentration state caused by the conductivity modulation. Consequently, a high current flows from the collector to the emitter.

(II) When the gate voltage decreases in a stepwise manner, the channel is formed and the flow of electrons shown by dotted arrow VIA stops. Also the electrons stop injecting across the P+/P/N junction in the collector region 4, and the reverse flow of holes shown by arrow VIB stops.

(III) Large amount of the carriers (electrons and holes) are accumulated in the N−-type drift layer 2. Electrons among the accumulated carriers are attracted by the collector region 4, which has a positive potential, and are charged to the collector across the schottky contact, which has no potential barrier (shown by arrow VID). The electrons can be easily pulled by the collector because of the schottky contact.

(IV) Since the electrons in the N−-type drift layer 2 are pulled by the collector, a charge balance in carriers is broken down. Therefore, holes in the N−-type drift layer 2 are attracted by the emitter region, which has a negative potential, and are discharged to the emitter through the P+-type contact layer 8 (shown by arrow VIE).

According to the above-described mechanism, because electrons accumulated in the on state can be attracted by the collector effectively through the schottky contact as described in process (III), the turn-off time can be reduced by the collector structure, in which the ohmic contact and the schottky contact are disposed as described in the present embodiment.

Additionally, in the lateral IGBT according to the present embodiment, attraction of the electrons depends on a schottky contact area. Therefore, the turn-off time can be reduced by increasing a ratio of the schottky contact area to the ohmic contact area. Specifically, when an area of an ohmic contact between the collector electrode 12 and the high impurity concentration region 4a is set to $S_i$, and an area of a schottky contact between the collector electrode 12 and the low impurity concentration region 4b is set to $S_e$, the ratio ($S_e/S_i$) of the schottky contact area to the ohmic contact area is set to within a range of 3 to 50.

Figure 7:
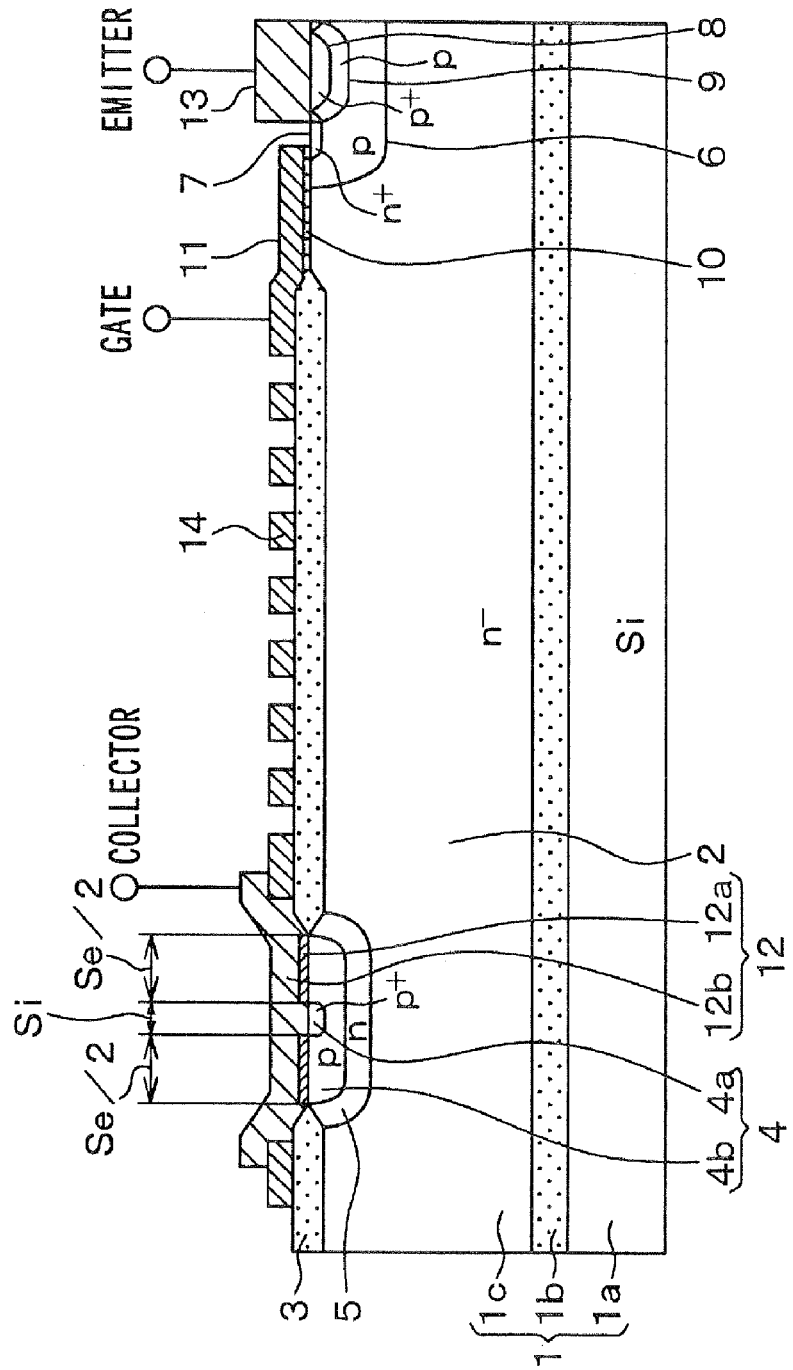
FIG. 7 is a diagram showing a cross sectional view of a relationship between an ohmic contact area $S_i$ and a schottky contact area $S_e$.

As shown in FIG. 7, a width of the ohmic contact and a width of the schottky contact are shown in the cross sectional view. The ohmic contact and the schottky contact are extended in a direction, which is perpendicular to a sheet of FIG. 7, with the same length. Therefore a ratio of the schottky contact width to the ohmic contact width is the same with the ratio ($S_e/S_i$) of the schottky contact area to the ohmic contact area. FIG. 7 only shows one of the emitters facing the collector. However, in an actual lateral IGBT, the other emitter is disposed at the left side of the collector in the sheet of FIG. 7. Therefore, the area of the schottky contact, which is placed both sides of the ohmic contact, is shown by $S_e/2$. An experimental result of a relationship between the ratio ($S_e/S_i$) of the schottky contact area to the ohmic contact area and the turn-off time $t_{off}$ is shown in FIG. 8.

Figure 8:
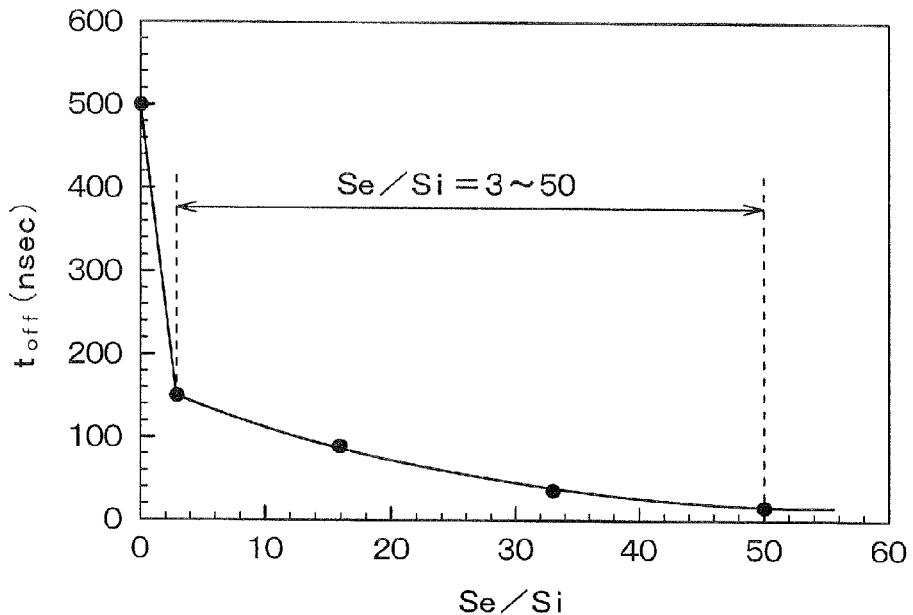
FIG. 8 is a graph showing a relationship between a ratio ($S_e/S_i$) of the schottky contact area to the ohmic contact area and a turn-off time $t_{off}$.

As shown in FIG. 8, the turn-off time $t_{off}$ decreases with the increasing ratio ($S_e/S_i$) of the schottky contact area $S_e$ to the ohmic contact area $S_i$. In a case where the $S_e/S_i$ ratio is set to 3 or greater, the turn-off time $t_{off}$ can be reduced to 150 nsec (0.15 µsec) or less, which is equal to or less than a half of the target time 0.3 µsec. According to the experimental results, when the $S_e/S_i$ ratio is set to within a range of 3 to 50, the turn-off time $t_{off}$ is 150 nsec or less. Thus, the turn-off time $t_{off}$ of the lateral IGBT can be reduced by setting the $S_e/S_i$ ratio within a range of 3 to 50.

Additionally, in the lateral IGBT, which is structured according to the present embodiment, an on-state voltage $V_{on}$ and a turn-off time $t_{off}$ depend on a P-type impurity surface concentration of the P-type region 4b, which is an interface of the schottky contact. Therefore, the P-type impurity surface concentration of the P-type region 4b may be set as below.

Figure 9:
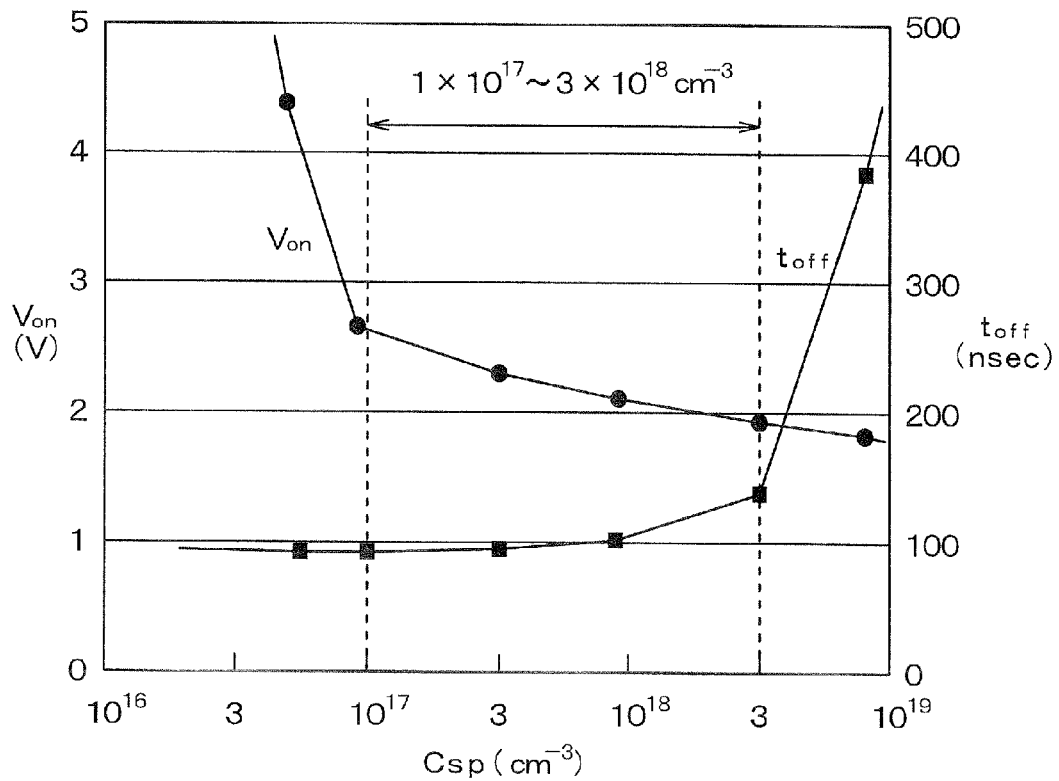
FIG. 9 is a graph showing a relationship between a P-type impurity surface concentration $C_{sp}$ of a P-type region 4b and an on-state voltage $V_{on}$ and a relationship between the P-type impurity surface concentration $C_{sp}$ of the P-type region 4b and a turn-off time $t_{off}$.

As shown in FIG. 9, the turn-off time $t_{off}$ increases sharply when the P-type impurity surface concentration $C_{sp}$ of the P-type region 4b is greater than $3\times10^{18}$ cm$^{-3}$. It is because the schottky contact may turn into the ohmic contact when the P-type impurity surface concentration $C_{sp}$ of the P-type region 4b is greater than $3\times10^{18}$ cm$^{-3}$. In the contrast, when the P-type impurity surface concentration $C_{sp}$ of the P-type region 4b is less than $1\times10^{17}$ cm$^{-3}$, the on-state voltage $V_{on}$ increases sharply with a decrease in the P-type impurity surface concentration $C_{sp}$. It is because, in this experiment, a N-type impurity concentration of the N-type buffer layer 5 is set to approximately $1\times10^{17}$ cm$^{-3}$. Therefore, the P-type region 4b may be compensated by N-type impurity included in the N-type buffer layer 5, and may turn into N-type in a case where the P-type impurity surface concentration $C_{sp}$ of the P-type region 4b is equal to or less than the N-type impurity concentration of the N-type buffer layer 5.

Accordingly, the on-state voltage $V_{on}$ can be reduced by doping the surface portion of the P-type region 4b at a higher P-type impurity surface concentration $C_{sp}$ than the N-type impurity concentration of the N-type buffer layer 5. Further, the turn-off time $t_{off}$ can be reduced by doping the surface portion of the P-type region 4b at a P-type impurity surface concentration $C_{sp}$ of $3\times10^{18}$ cm$^{-3}$ or less.

Reducing the turn-off time $t_{off}$ and maintaining a current drive capability are in a trade-off relationship. However, in the lateral IGBT according to the present embodiment, the turn-off time $t_{off}$ can be reduced with maintaining the current drive capability.

Figure 10:
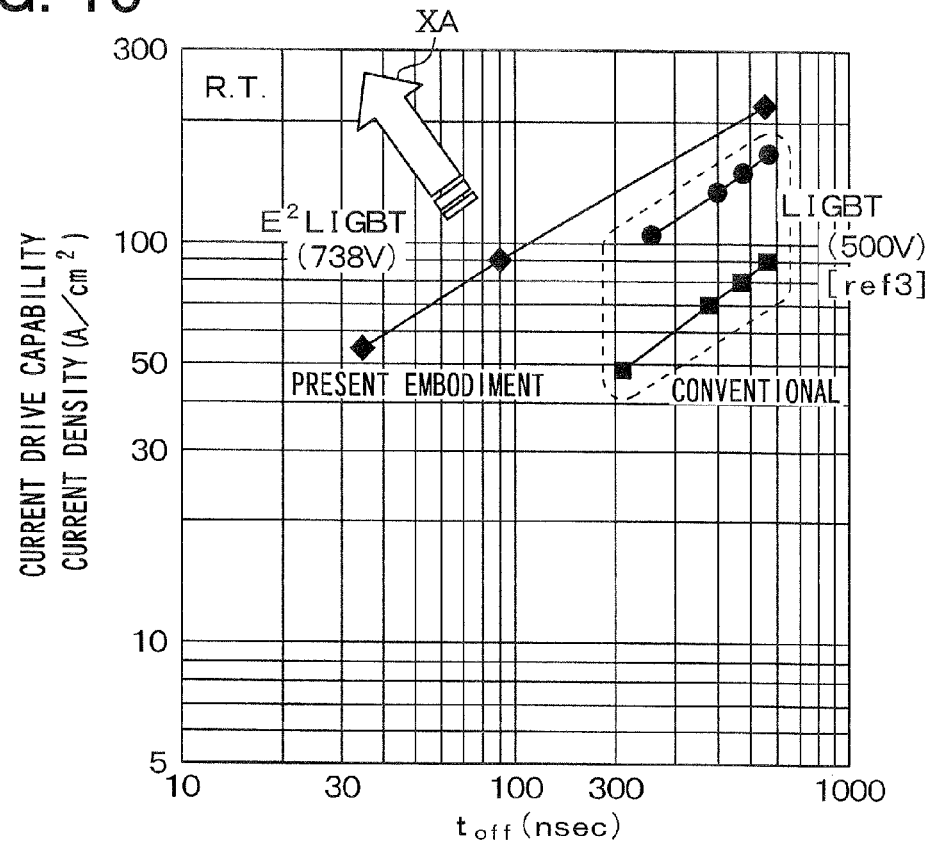
FIG. 10 is a graph showing a relationship between a turn-off time $t_{off}$ and a current drive capability.

As shown in FIG. 10, the current drive capability is measured as a current density under a condition that the gate voltage $V_G$ is set to 5V, and the voltage $V_{CE}$ between the collector and the emitter is set to 3V. A higher current density means a greater current drive capability, and a greater current drive capability means a lower on-state voltage. A characteristic of a conventional lateral IGBT is also shown in FIG. 10. The characteristic of the conventional lateral IGBT is referred to a characteristic of H. Funaki, et al., Proceeding of ISPSD '98, pp. 33-36, 1998.

In a left oblique upper direction shown by arrow XA in FIG. 10, the turn-off time $t_{off}$ can be reduced with maintaining the current drive capability at a high level and the characteristic of the lateral IGBT can be improved. As shown in FIG. 10, the lateral IGBT according to the present embodiment can have a shorter turn-off time $t_{off}$ than the conventional lateral IGBTs in a condition that all the IGBTs have the same current drive capability.

Figure 11A:
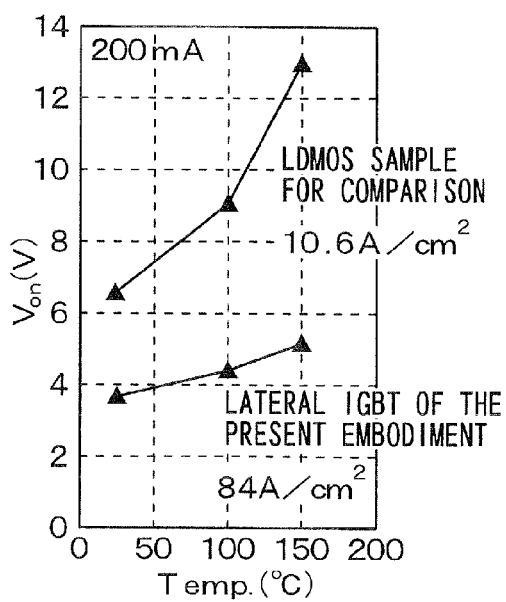
FIGS. 11A and 11B are graphs showing a temperature characteristic of an on-state voltage and a temperature characteristic of a turn-off time $t_{off}$ in the lateral IGBT respectively.
Figure 11B:
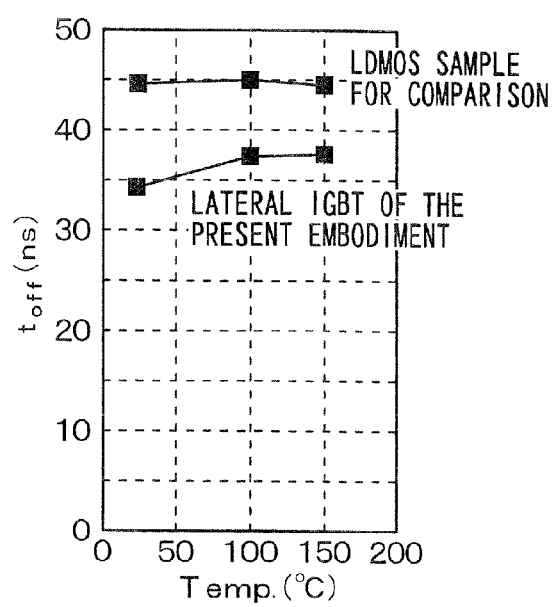

Further, an experimental result of a temperature characteristic of the on-state voltage and a temperature characteristic of the turn-off time $t_{off}$ in the lateral IGBT are shown by FIG. 11A and FIG. 11B respectively. To compare the lateral IGBT according to the present embodiment with a LDMOS, a sample of LDMOS having a surface area of 7.9 times larger than that of the lateral IGBT according to the present embodiment is made. Temperature characteristics of the LDMOS sample are shown by FIG. 11A and FIG. 11B respectively.

As shown in FIG. 11A, the on-state voltage $V_{on}$ changes slightly with increasing temperature in the lateral IGBT according to the present embodiment compared with the LDMOS sample. Therefore, the temperature characteristic of on-state voltage $V_{on}$ can be reduced in the lateral IGBT according to the present embodiment. As shown in FIG. 11B, the turn-off time $t_{off}$ keeps nearly unchanged with increasing temperature in the lateral IGBT according to the present embodiment. Further, the turn-off time $t_{off}$ of the lateral IGBT according to the present embodiment is shorter than the turn-off time $t_{off}$ of the LDMOS sample. As described above, the temperature characteristic of on-state voltage and the temperature characteristic of turn-off time $t_{off}$ in the lateral IGBT according to the present embodiment can be restricted, and the turn-off time $t_{off}$ of the lateral IGBT according to the present embodiment can be reduced.

In a conventional lateral diode, hole injection is restricted at an anode portion as shown in JP 4157184 (corresponding to U.S. Pat. No. 5,982,015) similar to the lateral IGBT. The lateral diode has a double-layered structure including a large P-well channel layer region having a low impurity concentration and a small P$^+$-type region having a high impurity concentration. Further, an anode is in schottky contact with the P-well region having a low impurity concentration, and is in ohmic contact with the P$^+$-type region having a high impurity concentration. As described above, the lateral diode can have a partially-formed schottky contact. However, in the lateral IGBT, it is not conceived that a schottky contact can be formed partially in terms of on-state voltage control. Further, in JP 4157184 (corresponding to U.S. Pat. No. 5,982,015), a lateral IGBT having a schottky contact and a method for structuring the schottky contact in the lateral IGBT are not clarified.

Differences between the lateral IGBT according to the present embodiment and the above-described lateral diode will be described with reference to FIG. 12 to FIG. 15.

Figure 12:
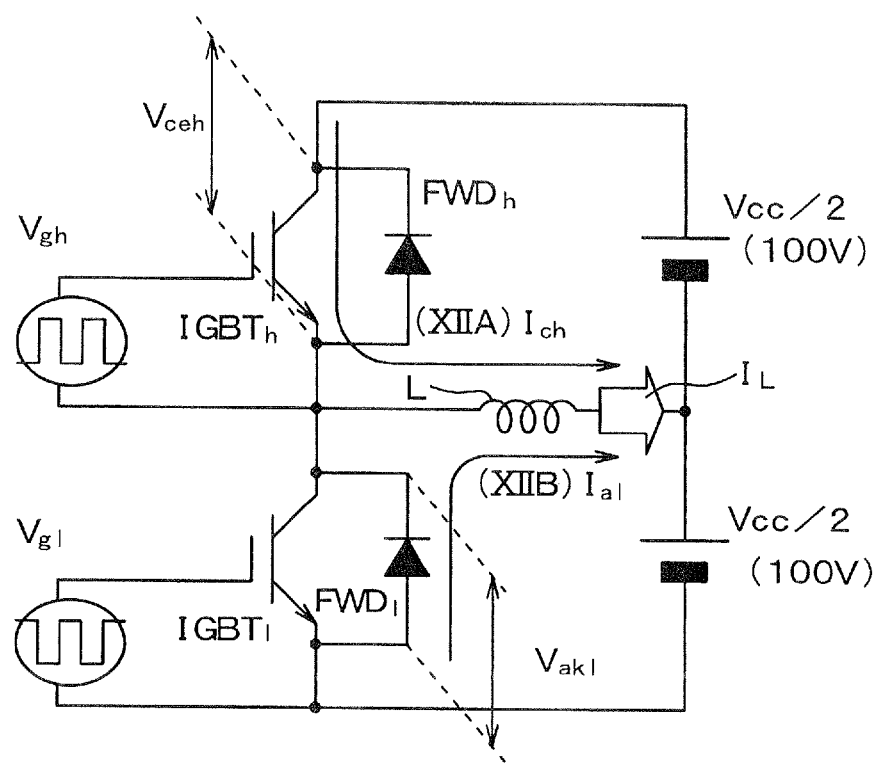
FIG. 12 is a circuit diagram of an example of a switching circuit in which, for example, an IGBT and a diode are disposed.
Figure 13:
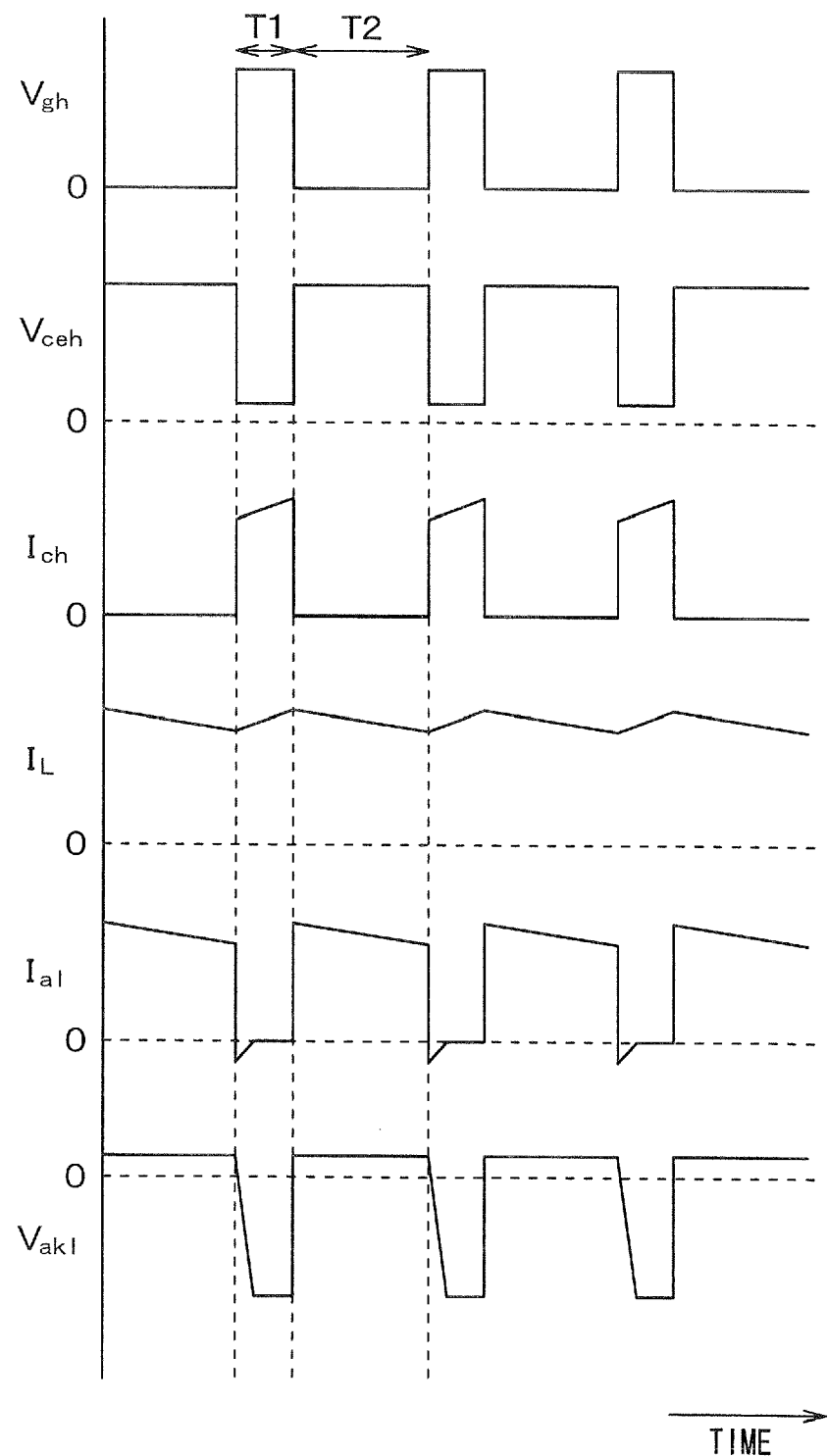
FIG. 13 is a time chart showing an operation process of the switching circuit shown in FIG. 12.

FIG. 12 shows an example of a switching circuit in which IGBTs and diodes are used. In the switching circuit, an upper side arm and a lower side arm are connected together, and both of the two arms include an IGBT and a free wheeling diode (hereafter referred to as FWD) that functions as a diode. In the circuit, a gate voltage $V_{gh}$ of an $IGBT_h$ and a gate voltage $V_{gl}$ of an $IGBT_l$ are controlled to perform push-pull operation continuously so that a current is supplied to the inductance load L. The $IGBT_h$ is disposed in the upper side arm and forms a high side, and the $IGBT_l$ is disposed in the lower side arm and forms a low side. FIG. 13 is a time chart showing an operation process of the switching circuit.

As shown in FIG. 12 and FIG. 13, during a time period $T_1$, the $IGBT_h$ turns on and a collector current $I_{ch}$ flows to the load L through a current pathway shown by arrow XIIA. The $IGBT_h$ is disposed in the upper arm and forms a high side switch. Additionally, during a time period $T_2$, $IGBT_h$ turns off and an anode current $I_{al}$ flows to the load L through a current pathway shown by arrow XIIB. The anode current $I_{al}$ is a free wheeling current formed by a FWD, of the low side. As a result, a load current $I_L$ continuously flows through the load L.

During the time period $T_1$, a voltage $V_{ceh}$ between a collector and an emitter of the $IGBT_h$ is approximately +2V, and a voltage $V_{akl}$ between an anode and a cathode of the $FWD_l$ is approximately −200V. During the time period $T_2$, the voltage $V_{ceh}$ between the collector and the emitter of the $IGBT_h$ is approximately +200V, and the voltage between the anode and the cathode of the $FWD_l$ is approximately +2V. As described above, when the IGBT and the FWD are off, a bias state of the IGBT and the FWD is that a voltage of +200V is applied to the collector of the IGBT, and a voltage of −200V is applied to the anode of the FWD.

According to the above description of FIG. 12 and FIG. 13, in a case where the lateral IGBT and the lateral diode are used in a switching circuit or an inverter circuit, a high positive voltage is applied between the collector and the emitter of the lateral IGBT as a bias condition when the lateral IGBT is off, and a high negative voltage is applied between the anode and the cathode of the lateral diode as a bias condition when the lateral diode is off. A relationship between a bias condition and an internal operation of a device will be described with reference to FIG. 14 and FIG. 15.

Figure 14:
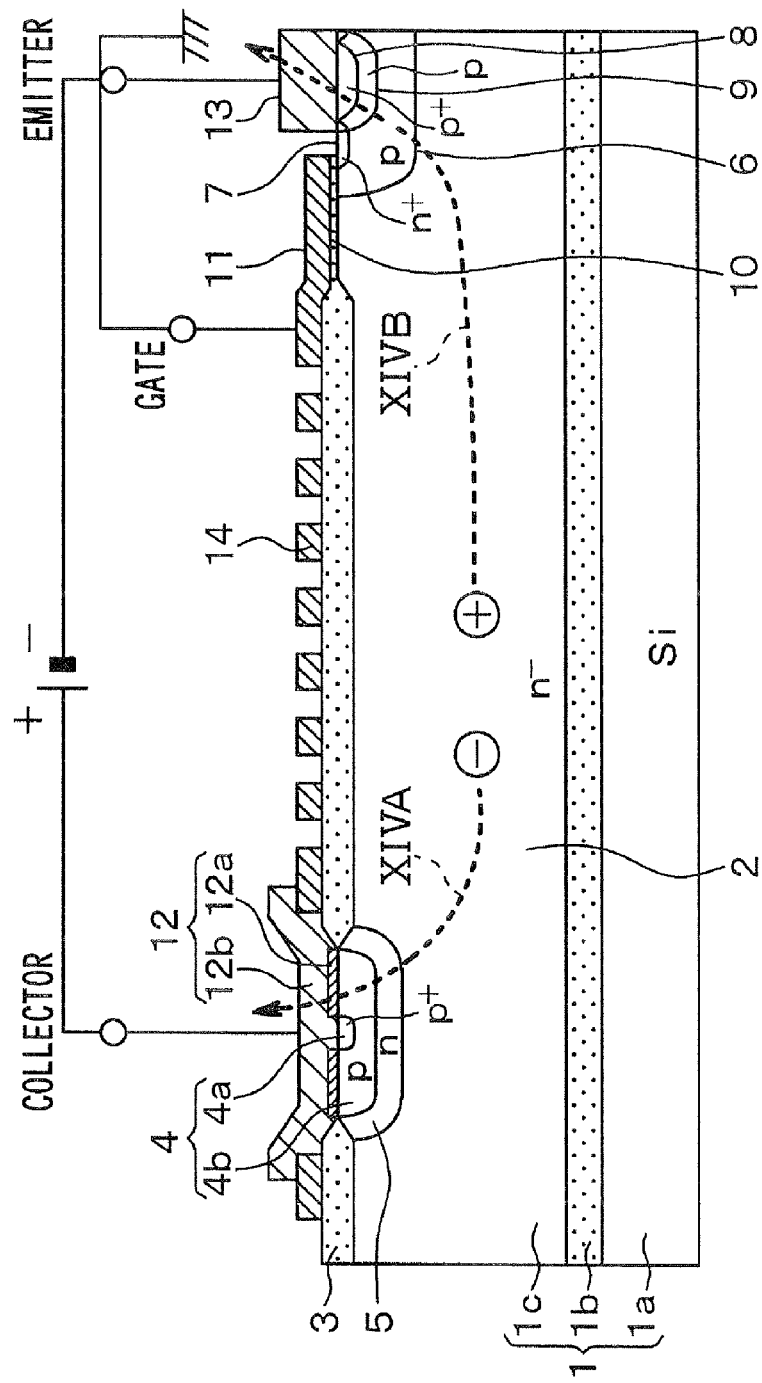
FIG. 14 is a diagram showing a cross sectional view of the lateral IGBT according to the first embodiment.
Figure 15:
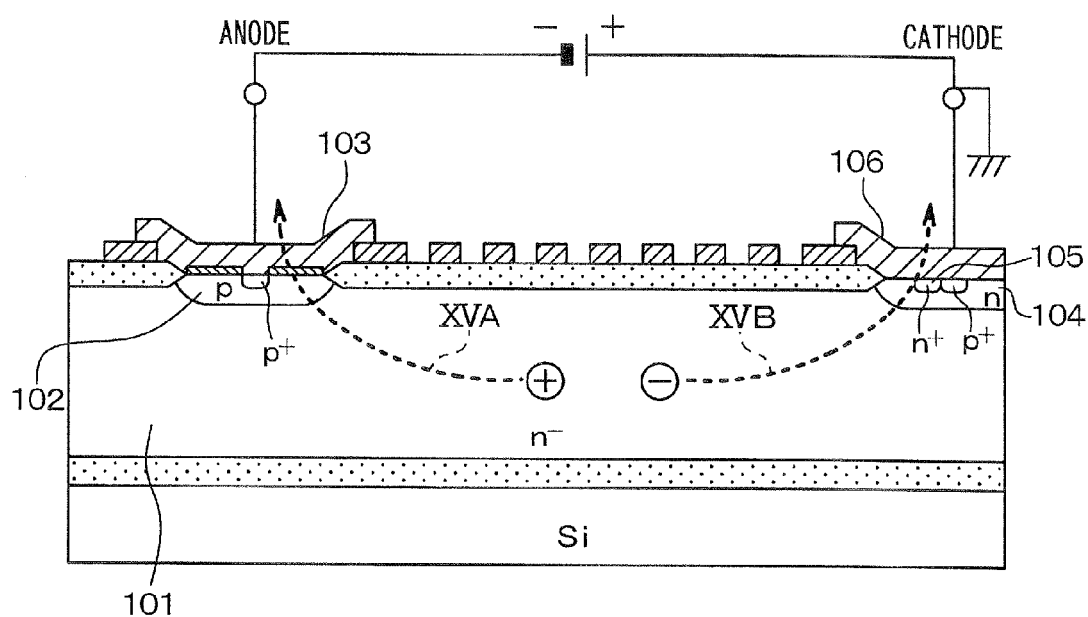
FIG. 15 is a diagram showing a cross sectional view of a lateral diode in which an ohmic contact and a schottky contact are combined.

FIG. 14 is a diagram showing a cross sectional view of the lateral IGBT according to the present embodiment. FIG. 15 is a cross sectional view of a lateral diode according to the lateral diode disclosed in JP 4157184 (corresponding to U.S. Pat. No. 5,982,015). In the lateral diode of FIG. 15, an ohmic contact structure and a schottky contact structure are combined in the lateral IGBT similar to the present embodiment.

As shown in FIG. 14, a voltage of +200V is applied to the collector of the lateral IGBT when the lateral IGBT is off. At this time, a small amount of electrons in the N⁻-type drift layer 2 are attracted by the collector, which has a positive potential, and are discharged to the collector electrode 12 through the N-type buffer layer 5, the P-type region 4b and the schottky contact (shown by arrow XIVA). And a small amount of holes in the N⁻-type drift layer 2 are attracted by the emitter, which has a negative potential, and are discharged to the emitter electrode 13 through the P-type body layer 9 and the P⁺-type contact layer 8 (shown by arrow XIVB). As described above, the electrons pass through the schottky contact in the collector.

As shown in FIG. 15, a voltage of −200V is applied to the anode of the lateral diode when the lateral diode is off. At this time, a small amount of holes in a N⁻-type drift layer 101 are attracted by the anode, which has a negative potential, and are discharged to the anode electrode 103 through a P-well channel layer 102 and the schottky contact (shown by arrow XVA). And a small amount of electrons are attracted by the cathode, which has a positive potential, and are discharged to a cathode electrode 106 through a N-well channel layer 104 and a N⁺-type contact layer 105 (shown by arrow XVB). As described above, the holes pass through the schottky contact in the anode.

It seems that the schottky contact structure and the ohmic contact structure formed in the lateral IGBT and the lateral diode have the same operating mechanism, however, according to the detailed analysis described above, the schottky contact structure and the ohmic contact structure formed in the lateral IGBT and the lateral diode have different operating mechanism. Accordingly, the above-described effects can be achieved by forming the schottky contact structure and the ohmic contact structure in the lateral IGBT according to the present embodiment.

In this way, a predetermined region can be stably in schottky contact in the lateral IGBT according to the present embodiment. Therefore, a high switching speed can be achieved, compared with a conventional lateral IGBT.

Second Embodiment

A second embodiment of the present invention will be described. Because, in the present embodiment, a configuration of the collector electrode 12 is changed from the first embodiment and the other is similar to the first embodiment, only different part will be described.

Figure 16:
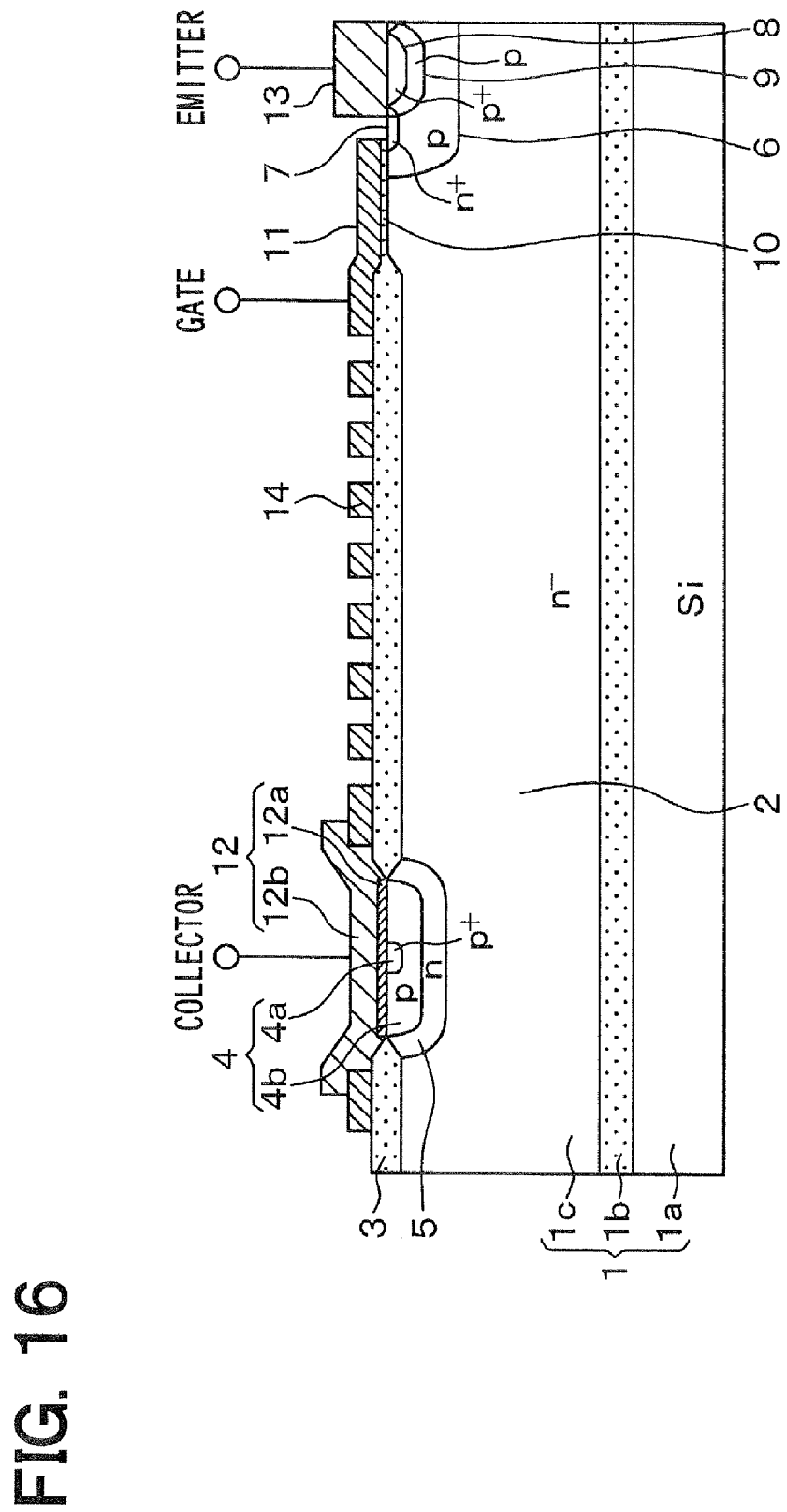
FIG. 16 is a diagram showing a cross sectional view of a N-channel lateral IGBT according to a second embodiment of the present invention.

As shown in FIG. 16, in the present embodiment, the barrier metal 12a, which is a part of the collector electrode 12, is not just formed on the surface of the P-type region 4b, but also formed on the surface of the P⁺-type region 4a. A contact type between the barrier metal 12a and the semiconductor is defined by a relationship between a material of the barrier metal 12a and an impurity concentration of the semiconductor. In a case where the barrier metal 12a is formed on both of the surfaces of the P⁺-type region 4a and the P-type region 4b, the contact types can be changed by an impurity concentration in the P⁺-type region 4a and an impurity concentration in the P-type region 4b. Additionally, in the present embodiment, the P-type region 4b has a lower impurity concentration than an impurity concentration of the P⁺-type region 4a so that the P-type region 4b is in schottky contact with the barrier metal 12a. Therefore, the barrier metal 12a is in ohmic contact with the P⁺-type region 4a, and is in schottky contact with the P-type region 4b.

As described above, the same effect with the effect of the first embodiment can be achieved in a case where the barrier metal 12a is not just formed on the surface of the P-type region 4b, but also formed on the surface of the P⁺-type region 4a. Further, a patterning of the barrier metal 12a can be easily performed and a positional shift of a mask can be restricted in a case where the barrier metal 12a is not just formed on the surface of the P-type region 4b, but also formed on the surface of the P⁺-type region 4a.

Third Embodiment

A third embodiment of the present invention will be described. Because, in the present embodiment, a configuration of the collector region 4 is changed from the first embodiment and the other is similar to the first embodiment, only different part will be described.

Figure 17:
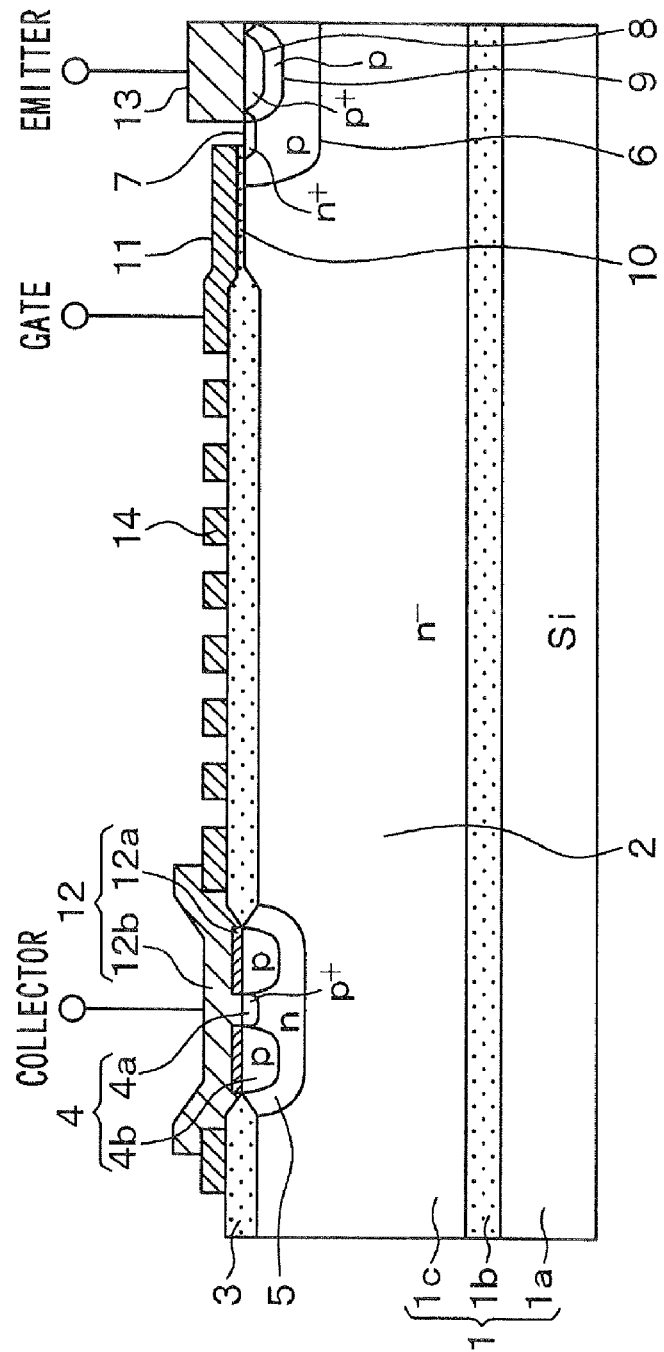
FIG. 17 is a diagram showing a cross sectional view of a N-channel lateral IGBT according to a third embodiment of the present invention.

As shown in FIG. 17, in the present embodiment, a P-type region 4b is only disposed aside of a P+-type region 4a forming the collector region 4. However, the P-type region 4b is not formed under the P+-type region 4a and the P+-type region 4a is not surrounded by the P-type region 4b.

As described above, the P+-type region 4a may not be surrounded by the P-type region 4b. In this structure, the same effect with the effect of the first embodiment can be achieved.

Fourth Embodiment

A fourth embodiment of the present invention will be described. Because, in the present embodiment, a semiconductor substrate other than a SOI substrate is used compared with the first embodiment and the other is similar to the first embodiment, only different part will be described.

Figure 18:
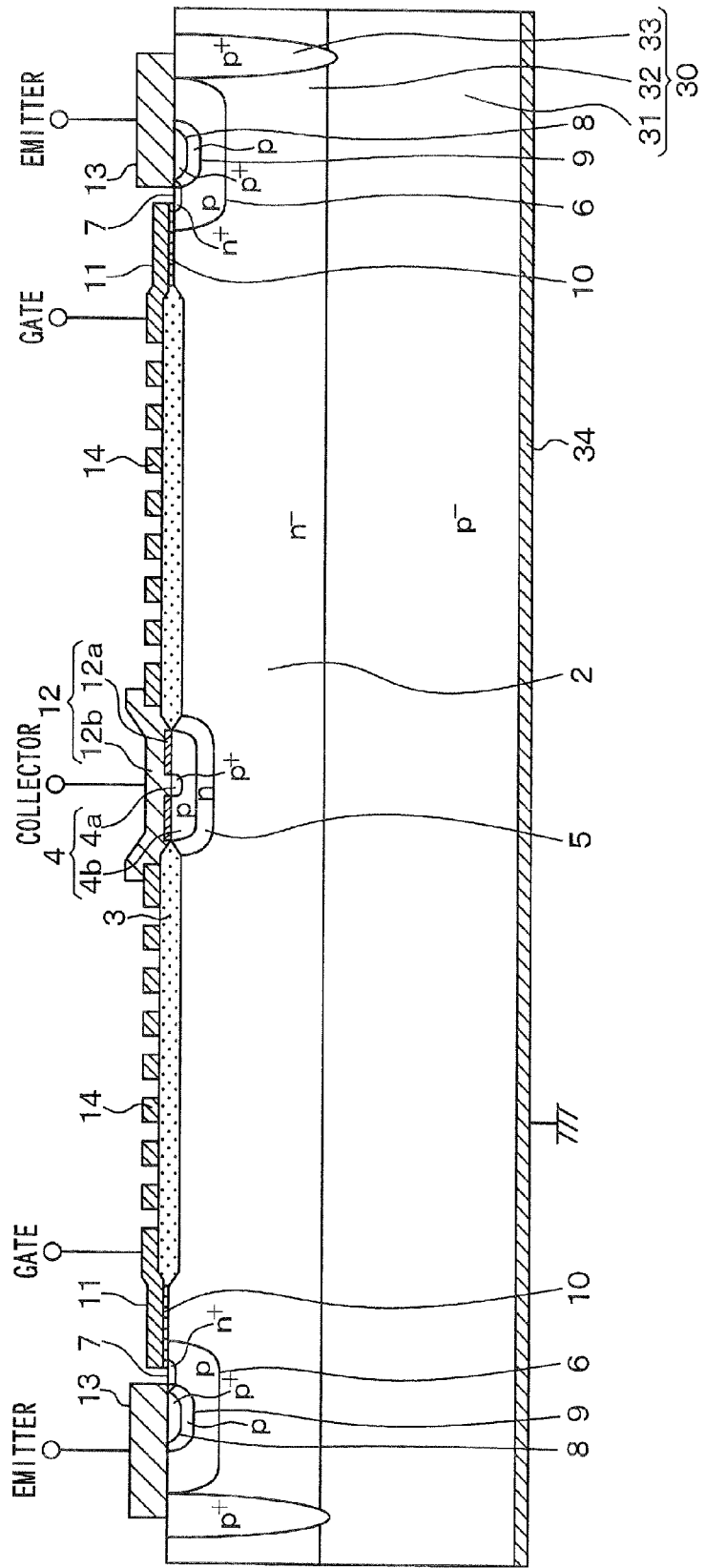
FIG. 18 is a diagram showing a cross sectional view of a N-channel lateral IGBT according to a fourth embodiment of the present invention.

As shown in FIG. 18, a substrate in which a N−-type silicon layer 32 is formed on a P−-type silicon substrate 31 is used as a semiconductor substrate. The N−-type silicon layer 32 functions as a N−-type drift layer 2. A P+-type isolating region 33 is formed on a surface of the N−-type drift layer 2 to penetrate the N−-type drift layer 2 and to reach the P−-type silicon substrate 31. The P+-type isolating region 33 is formed to surround the periphery of the lateral IGBT. The P+-type isolating region 33 and the N−-type drift layer 2 form a P—N junction isolation structure. Additionally, a GND pattern 34 is formed on a back side of a semiconductor substrate 30. The P−-type silicon substrate 31 is connected to the ground by connecting the GND pattern 34 to the ground.

As described above, a lateral IGBT may also be a junction isolation type lateral IGBT in which a silicon substrate such as the P−-type silicon substrate 31 is used as the semiconductor substrate 30.

Fifth Embodiment

A fifth embodiment of the present invention will be described. Because, also in the present embodiment, a semiconductor substrate other than a SOI substrate is used compared with the first embodiment and the other is similar to the first embodiment, only different part will be described.

Figure 19:
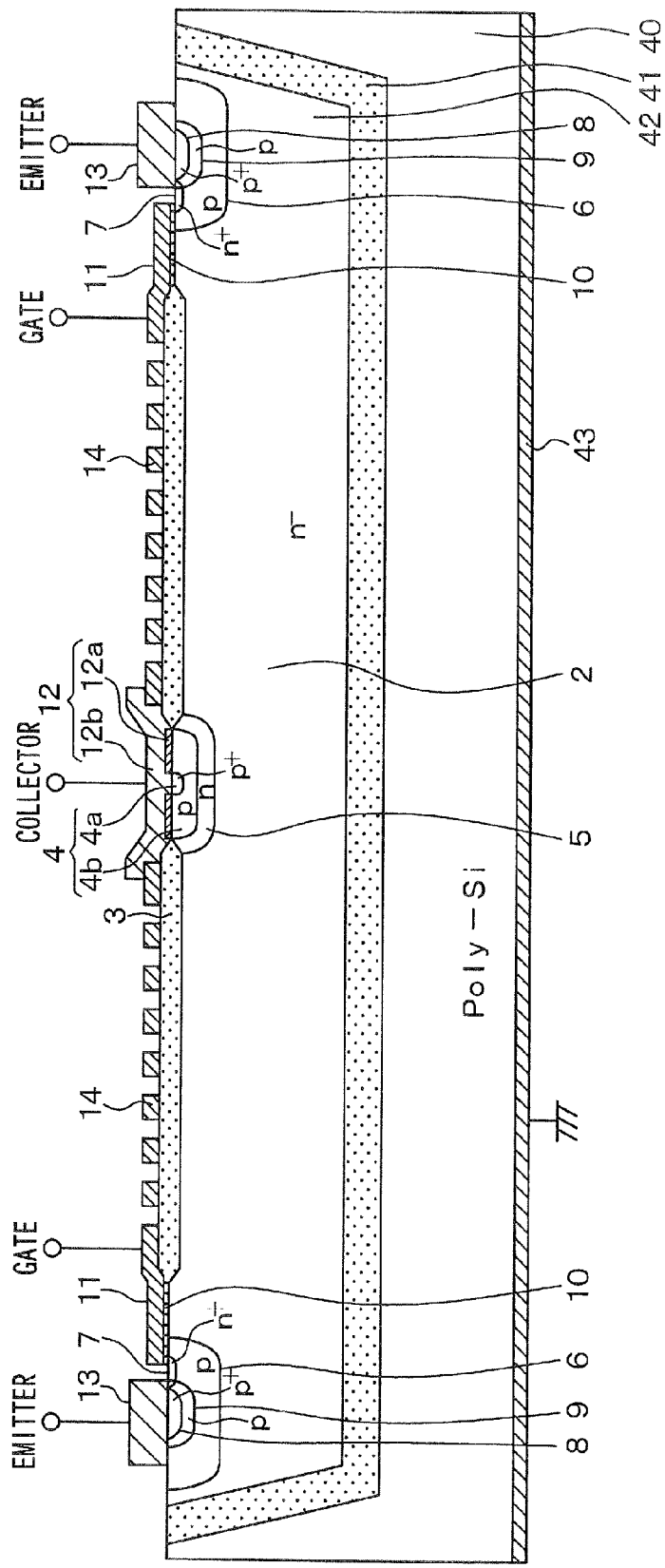
FIG. 19 is a diagram showing a cross sectional view of a N-channel lateral IGBT according to a fifth embodiment of the present invention.

As shown in FIG. 19, a substrate made of polysilicon is used as a semiconductor substrate 40. A silicon oxide film 41 is formed in the semiconductor substrate 40 to surround a region in which the lateral IGBT is formed. An inside part of the silicon oxide film 41 forms a N−-type silicon layer 42. The N−-type silicon layer 42 functions as a N−-type drift layer 2, and in this way a dielectric isolation type (dielectric isolation type) lateral IGBT is formed. Additionally, a GND pattern 43 is formed on a back side of the semiconductor substrate 40. The semiconductor substrate 40 is grounded by connecting the GND pattern 43 to the ground.

As described above, a lateral IGBT may also be a dielectric isolation type lateral IGBT in which a substrate made of polysilicon is used as the semiconductor substrate 40, and the N−-type drift layer 2 is surrounded by an isolation film such as the silicon oxide film 41.

Other Embodiments

In each of the above-described embodiments, the P+-type region 4a are formed in a strip-like shape. The strip-like shape is only an example and the P+-type region 4a may have any shapes other than the strip-like shape.

Figure 20:
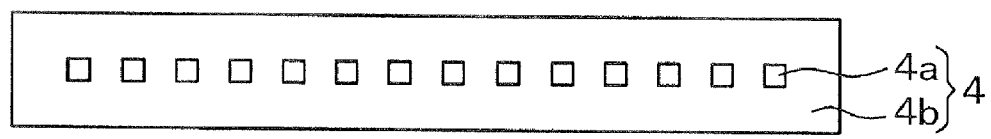
FIG. 20 is a diagram showing a top plan view of a layout of a lateral IGBT according to other embodiments.

As shown in FIG. 20, the P+-type region 4a may have a layout shaped in a plurality of segmentalized dots within the P-type region 4b. The amount of holes to be injected depends on a total area (volume) of the P+-type region 4a. Therefore, in a case where the P+-type region 4a is segmentalized in dots, a width of each segmentalized dot of the P+-type region 4a can be increased compared with a case in which a P+-type region 4a is not segmentalized. Accordingly, a width of an open portion of a mask can be increased and the mask can be easily manufactured. As a result, the P+-type region 4a can be easily manufactured. A layout of the P+-type region 4a can have any shapes such as comb-like shape other than dot shape.

Figure 21:
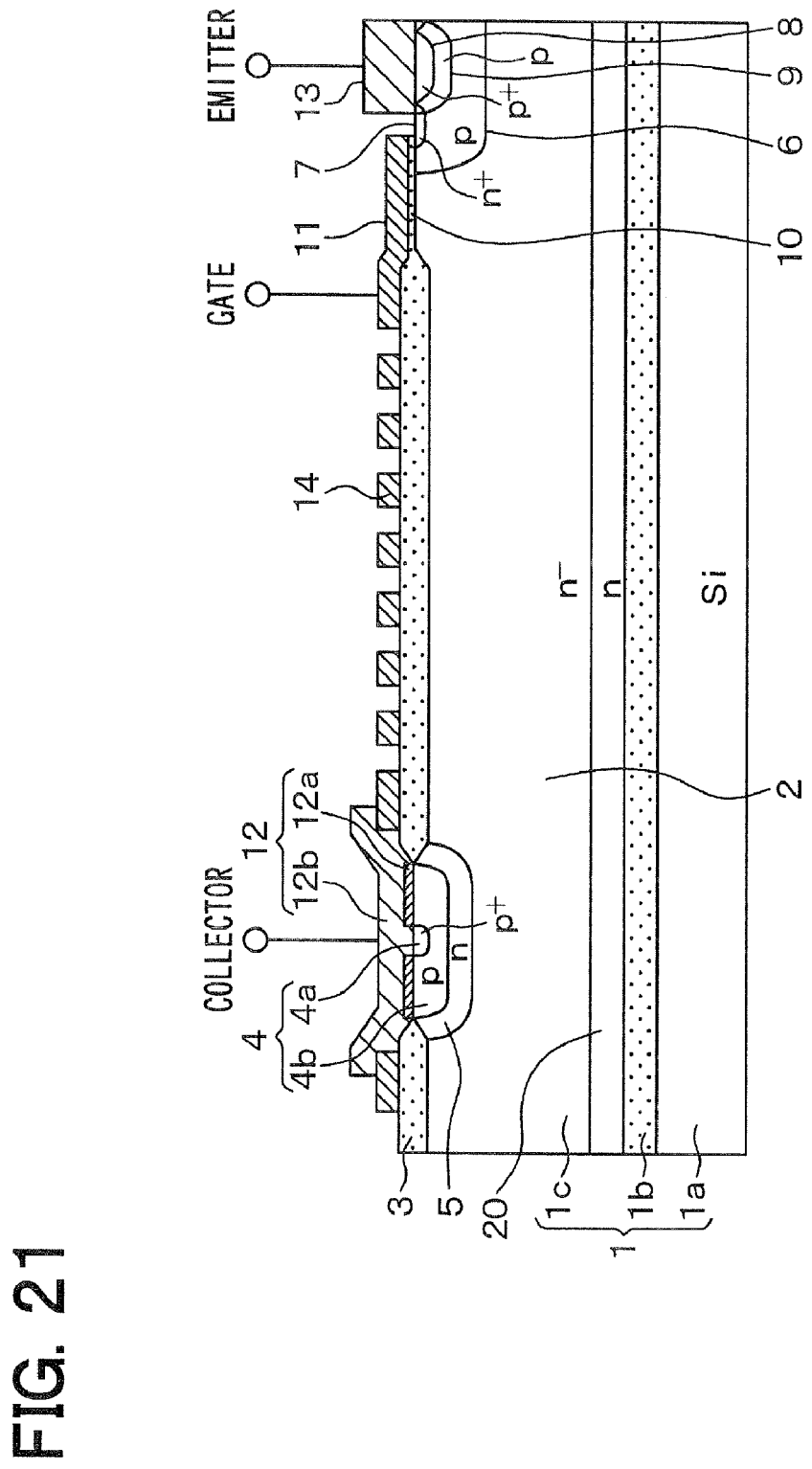
FIG. 21 is a diagram showing a cross sectional view of a lateral IGBT according to other embodiments.

In each of the above-described embodiments, as shown in FIG. 21, a N-type impurity region 20 may be disposed at a back side of the active layer 1c, which is in contact with the buried oxide 1b. The N-type impurity region 20 is doped at a higher impurity concentration than a concentration of the active layer 1c. In this way, a high breakdown voltage can be obtained. When the N-type impurity region 20 is formed, the concentration of each part, which is set in the first embodiment, may be adjusted. For example, in a case where the N-type impurity region 20 is 4 μm thick, and is doped with N-type impurity at a concentration of $1.25 \times 10^{16}$ cm$^{-3}$, a part of the active layer 1c other than the N-type impurity region 20 may be doped with N-type impurity at a concentration of approximately $1.0 \times 10^{14}$ cm$^{-3}$.

Figure 22:
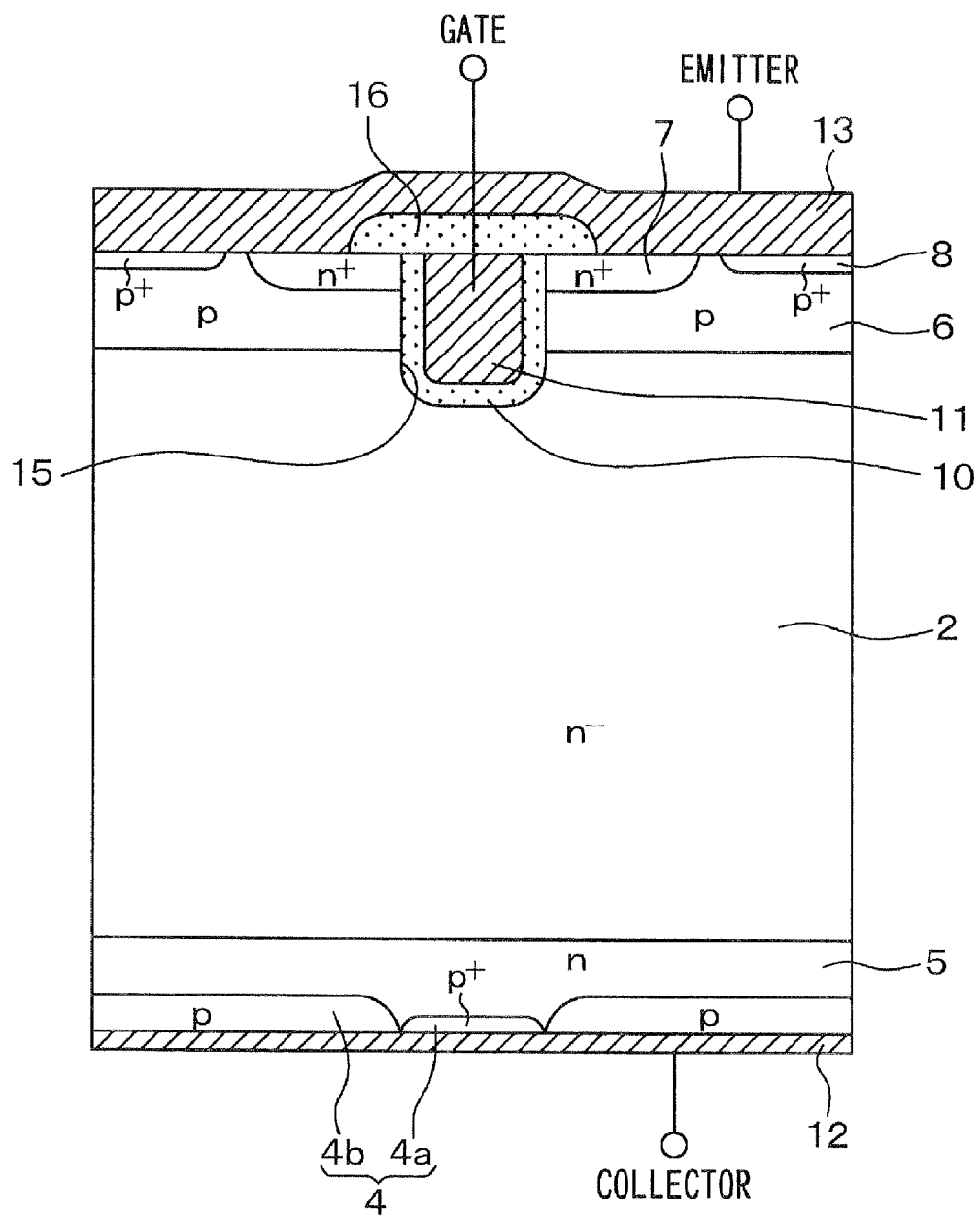
FIG. 22 is a diagram showing a cross sectional view of a vertical IGBT according to other embodiments.

Additionally, in each of the above-described embodiments, the present invention is applied in a lateral IGBT. Alternatively, the present invention may also be applied in a vertical IGBT. FIG. 22 is a diagram showing a cross sectional view of a N-channel vertical IGBT according to the present embodiment. As shown in FIG. 22, a P-type collector region 4 is formed on a back side of a N−-type drift layer 2 via a N-type buffer layer 5 which functions as a FS layer interposed therebetween. A P-well channel layer 6 is formed on a surface of the N−-type drift layer 2. A N+-type emitter region 7 and a P-type contact layer 8 are formed in a surface portion of the P-well channel layer 6. A trench 15 is formed to penetrate the N+-type emitter region 7 and the P-well channel layer 6 and to reach the N−-type drift layer 2. A gate electrode 11, which is made of material such as doped polysilicon, is disposed in the trench 15 via a gate insulation film 10 interposed therebetween. Further, an emitter electrode 13 and gate wiring are formed on the P-well channel layer 6 via an interlayer insulator 16 interposed therebetween. The gate wiring is not shown in the figure. The emitter electrode 13 is electrically coupled with the N+-type emitter region 7 and the P-type contact layer 8 via a contact hole. The gate wiring is electrically coupled with the gate electrode 11 via a contact hole. At a back side of the substrate, a collector electrode 12 is coupled to the collector region 4. In this way, a vertical IGBT is formed.

In the vertical IGBT having a above-described structure, the collector region 4 includes a P+-type region 4a and a P-type region 4b. The P+-type region 4a is in ohmic contact with the collector electrode 12, and the P-type region 4b is in schottky contact with the collector electrode 12. In this way, the same effect with the effect of the lateral IGBT can be achieved.

The above disclosure has the following aspects.

According to an aspect of the present disclosure, a N-channel lateral insulated-gate bipolar transistor includes a semiconductor substrate; a drift layer having a N conductive type and disposed on the substrate; a collector region which is a P conductive type and is disposed in a first surface portion of the drift layer; a channel layer which is a P conductive type and is disposed in a second surface portion of the drift layer apart from the collector region; an emitter region which is a N conductive type and has a higher impurity concentration than the drift layer and, the emitter region disposed in a first surface portion of the channel layer and having an end portion terminated inside of a terminated portion of the channel layer; a gate insulation film disposed on a channel region, which is provided by a second surface portion of the channel layer between the emitter region and the drift layer; a gate electrode disposed on the gate insulation film; a collector electrode electrically coupled with the collector region; and an emitter electrode electrically coupled with the emitter region and the channel layer. The collector region includes a high impurity concentration region having a high impurity concentration and a low impurity concentration region having a lower impurity concentration than the high impurity concentration region. The collector electrode is in ohmic contact with the high impurity concentration region and in schottky contact with the low impurity concentration region.

In the above device, since the collector electrode is in ohmic contact with the high impurity concentration region and in schottky contact with the low impurity concentration region, an efficiency of hole injection is reduced by restricting hole injection. Therefore, a lateral IGBT structured to achieve a high switching speed without controlling a lifetime can be obtained.

Alternatively, the collector electrode may include a barrier metal. The barrier metal is sandwiched between the collector electrode and the low impurity concentration region and is in schottky contact with the low impurity concentration region. In this case, the barrier metal is disposed on the low impurity concentration region so that the collector electrode is in schottky contact with the low impurity concentration region reliably. Thus the schottky contact region can be defined and the predetermined region can be stably in schottky contact with the collector electrode and the lateral IGBT having a schottky contact can be easily manufactured.

Alternatively, the barrier metal may have a work function of 4.9 eV or less. In this way, the efficiency of hole injection can be reduced much more. Thus, it is possible to speed up a switching operation further more.

Alternatively, the lower impurity concentration of the low impurity concentration region may be set to $3 \times 10^{18}$ cm$^{-3}$ or less. Thus, the schottky contact is restricted from turning into the ohmic contact and the turn-off time can be reliably reduced.

Further, the N conductive type buffer layer may be disposed in a third surface portion of the drift layer to surround the collector region. The N conductive type buffer layer may have an impurity concentration in a range between $1 \times 10^{15}$ cm$^{-3}$ and $1 \times 10^{18}$ cm$^{-3}$. Further, the N conductive type buffer layer may also have an impurity concentration in a range between $4 \times 10^{16}$ cm$^{-3}$ and $1 \times 10^{18}$ cm$^{-3}$. In this case, since the hole injection can be restricted by the contact type between the collector region and the collector electrode, the buffer layer can be used only as a FS (field stop) layer without restricting the hole injection. Thus, the buffer layer can have a low impurity concentration that is low enough not to change the efficiency of hole injection in the collector side.

Alternatively, the lower impurity concentration of the low impurity concentration region may be higher than the N conductive type impurity concentration of the buffer layer. In this case, since the lower impurity concentration of the low impurity concentration region is higher than the N conductive type impurity concentration of the buffer layer, the low impurity concentration region is restricted from being compensated by the N conductive impurity included in the N conductive type buffer layer and turning into the N conductive type. Thus, the on-state voltage $V_{on}$ can be reduced reliably.

Alternatively, the area of the ohmic contact, which is placed between the collector electrode and the high impurity concentration region, is defined as $S_i$, and the area of the schottky contact, which is placed between the collector electrode and the low impurity concentration region, is defined as $S_e$, the ratio ($S_e/S_i$) of the schottky contact area to the ohmic contact area may be set to within a range of 3 to 50. The turn-off time $t_{off}$ decreases with the increasing ratio ($S_e/S_i$) of the schottky contact area $S_e$ to the ohmic contact area $S_i$. When the $S_e/S_1$ ratio is set to 3 or greater, the turn-off time $t_{off}$ can be reduced to 150 nsec (0.15 μsec) or less, which is equal to or less than a half of the target time 0.3 μsec. According to the experimental results, when the $S_e/S_i$ ratio is set to within a range of 3 to 50, the turn-off time $t_{off}$ is 150 nsec or less. Thus, the turn-off time $t_{off}$ of the lateral IGBT can be reduced by setting the $S_e/S_i$ ratio within a range of 3 to 50.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A N-channel lateral insulated-gate bipolar transistor comprising:
    a semiconductor substrate;
    a drift layer having a N conductive type and disposed on the semiconductor substrate;
    a collector region which is a P conductive type and is disposed in a first surface portion of the drift layer;
    a channel layer which is a P conductive type and is disposed in a second surface portion of the drift layer apart from the collector region;
    an emitter region which is a N conductive type and has a higher impurity concentration than the drift layer, the emitter region disposed in a first surface portion of the channel layer and having an end portion terminated inside of a terminated portion of the channel layer;
    a gate insulation film disposed on a channel region, which is provided by a second surface portion of the channel layer between the emitter region and the drift layer;
    a gate electrode disposed on the gate insulation film;
    a collector electrode electrically coupled with the collector region; and
    an emitter electrode electrically coupled with the emitter region and the channel layer,
    wherein the collector region includes a high impurity concentration region having a high impurity concentration and a low impurity concentration region having a lower impurity concentration than the high impurity concentration region, and
    wherein the collector electrode is in ohmic contact with the high impurity concentration region and in schottky contact with the low impurity concentration region.

2. The lateral insulated-gate bipolar transistor according to claim 1,
    wherein the collector electrode includes a barrier metal, which is sandwiched between the collector electrode and the low impurity concentration region, and
    wherein the barrier metal is in schottky contact with the low impurity concentration region.

3. The lateral insulated-gate bipolar transistor according to claim 2,
wherein the barrier metal has a work function of 4.9 eV or less.

4. The lateral insulated-gate bipolar transistor according to claim 1,
wherein the lower impurity concentration of the low impurity concentration region is set to $3\times10^{18}$ cm$^{-3}$ or less.

5. The lateral insulated-gate bipolar transistor according to claim 1, further comprising:
a N conductive type buffer layer disposed in a third surface portion of the drift layer to surround the collector region, and has an impurity concentration in a range between $1\times10^{15}$ cm$^{-3}$ and $1\times10^{18}$ cm$^{-3}$.

6. The lateral insulated-gate bipolar transistor according to claim 5,
wherein the N conductive type buffer layer has an impurity concentration in a range between $4\times10^{16}$ cm$^{-3}$ and $1\times10^{18}$ cm$^{-3}$.

7. The lateral insulated-gate bipolar transistor according to claim 5,
wherein the lower impurity concentration of the low impurity concentration region is higher than a N conductive type impurity concentration of the buffer layer.

8. The lateral insulated-gate bipolar transistor according to claim 1, wherein:
an area of an ohmic contact, which is placed between the collector electrode and the high impurity concentration region, is defined as $S_i$;
an area of a schottky contact, which is placed between the collector electrode and the low impurity concentration region, is defined as $S_e$; and
a ratio $S_e/S_i$ of the schottky contact area to the ohmic contact area is set to within a range of 3 to 50.

* * * * *